United States Patent
Inoue

(10) Patent No.: US 6,667,515 B2
(45) Date of Patent: Dec. 23, 2003

(54) HIGH BREAKDOWN VOLTAGE SEMICONDUCTOR DEVICE

(75) Inventor: Tomoki Inoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 10/053,660

(22) Filed: Jan. 24, 2002

(65) Prior Publication Data

US 2002/0100935 A1 Aug. 1, 2002

(30) Foreign Application Priority Data

Jan. 26, 2001 (JP) ........................................ 2001-018013

(51) Int. Cl.[7] .............................................. H01L 29/76
(52) U.S. Cl. ..................... 257/341; 257/341; 257/339
(58) Field of Search ................................. 257/341, 484, 257/139, 492, 397, 481, 475; 357/15

(56) References Cited

U.S. PATENT DOCUMENTS

| | | | | |
|---|---|---|---|---|
| 4,521,795 A | * | 6/1985 | Coe et al. ................... 257/341 |
| 4,742,377 A | * | 5/1988 | Einthoven ................... 257/484 |
| 5,585,651 A | * | 12/1996 | Kitagawa et al. ........... 257/139 |
| 5,795,793 A |   | 8/1998 | Kinzer |
| 5,859,465 A | * | 1/1999 | Spring et al. ............... 257/484 |
| 5,969,400 A | * | 10/1999 | Shinohe et al. ............. 257/492 |
| 6,022,790 A |   | 2/2000 | Wagers et al. |
| 6,191,015 B1 | * | 2/2001 | Losehand et al. ........... 438/570 |

* cited by examiner

Primary Examiner—David Nelms
Assistant Examiner—Thinh T. Nguyen
(74) Attorney, Agent, or Firm—Oblon, Spivak, McClelland, Maier & Neustadt, P.C.

(57) ABSTRACT

A high breakdown voltage semiconductor device includes an active area and a surrounding region. In the active area, a second semiconductor layer of a second conductivity type is formed in a first semiconductor layer of a first conductivity type. A third semiconductor layer of the first conductivity type is formed in the second semiconductor layer. A gate electrode faces through a gate insulating film the second semiconductor layer. A first main electrode is connected to the second and third semiconductor layers. A ring layer of the second conductivity type surrounds the active area at a position in the surrounding region. A first low-resistivity layer is formed in the ring layer and has a resistivity lower than that of the ring layer. The first low-resistivity layer is connected to the first main electrode.

44 Claims, 13 Drawing Sheets

HIGH BREAKDOWN VOLTAGE SEMICONDUCTOR DEVICE

CROSS-REFERENCE TO RELATED APPLICATIONS

This application is based upon and claims the benefit of priority from the prior Japanese Patent Application No. 2001-018013, filed Jan. 26, 2001, the entire contents of which are incorporated herein by reference.

BACKGROUND OF THE INVENTION

1. Field of the Invention

The present invention relates to a high breakdown voltage semiconductor device having an insulated gate structure, such as an IGBT (Insulated Gate Bipolar Transistor), or a MOSFET (Metal Oxide Semiconductor Field Effect Transistor).

2. Description of the Related Art

An IGBT is a voltage-controlled device having both a high-speed switching characteristic like a MOSFET and a high power handling capability like a bipolar transistor. In recent years, IGBTs are widely used in power converters and switched mode power supplies in the power electronics field.

An explanation will be given of the structure of a conventional IGBT, taking a vertical type n-channel IGBT as an example, with reference to FIGS. 23 and 24. In general, arrays of IGBT unit cells are disposed in stripes in the central area (corresponding to an active area) other than the peripheral region (corresponding to a junction-termination region) on a semiconductor substrate. For the sake of simplicity, the IGBT will be partly explained, focusing on necessary portions.

FIG. 23 is a sectional view schematically showing the junction-termination region and a portion of the active area near there, of a conventional IGBT. FIG. 24 is a plan view taken along line XXIV—XXIV in FIG. 23.

As shown in FIG. 23, p-base layers 102 are formed by diffusion in the surface of an $n^-$-base layer 101. $N^+$-emitter layers 103 are formed by diffusion in the surfaces of the p-base layers 102. A gate electrode 106 is formed through a gate insulating film 107 on each of the portions of the p-base layers 102 between the $n^-$-base layer 101 and the $n^+$-emitter layers 103. An emitter electrode 109 is disposed in ohmic-contact with the $n^+$-emitter layers 103 and the p-base layers 102. A $p^+$-emitter layer 105 is formed through an n-buffer layer 104 on the bottom side of the $n^-$-base layer 101. A collector electrode 110 is disposed in ohmic-contact with the $p^+$-emitter layer 105.

As shown in FIG. 24, a $p^+$-ring layer 111 is formed in the junction-termination region and surrounds the central area (the active area) in which the arrays of IGBT unit cells are formed. The $p^+$-ring layer 111 is electrically connected to the emitter electrode 109 through a connection electrode 109b, which is integral with the emitter electrode 109. A ring-like $n^+$-diffusion layer 114 is formed in the junction-termination region, along the peripheral edge thereof. A ring-like stopper electrode 115 in an electrically floating state is disposed on the $n^+$-diffusion layer 114. The $n^+$-diffusion layer 114 and the stopper electrode 115 constitute an equi-potential ring 116. A $p^-$-RESURF (Reduced Surface Field) layer 112 is formed between the $p^+$-ring layer 111 and the $n^+$-diffusion layer 114 and in contact with the $p^+$-ring layer 111. The surface of the $n^-$-base layer 101 from the $p^+$-ring layer 111 to the $n^+$-diffusion layer 114 is covered with an insulating protection film 108.

When the IGBT is turned on, the following operation is performed. Specifically, while a positive bias is applied between the collector electrode 110 and the emitter electrode 109 (the plus is on the collector electrode 110 side), a positive voltage (a positive bias) relative to the emitter electrode 109 is applied to the gate electrodes 106. By doing so, n-inversion layers (not shown) are formed near the interfaces between the p-base layers 102 and the gate insulating films 107, and thus electrons are injected from the $n^+$-emitter layers 103 into the $n^-$-base layer 101. In accordance with the injection amount of the electrons, holes are injected from the $p^+$-emitter layer 105 into the $n^-$-base layer 101. As a result, the $n^-$-base layer 101 is filled with carriers and causes a conductivity modulation, and thus the resistance of the $n^-$-base layer 101 decreases to bring the IGBT into an ON-state.

On the other hand, when the IGBT is turned off, the following operation is performed. Specifically, in the ON-state described above, a negative bias is applied to the gate electrodes 106. By doing so, the n-inversion layers near the interfaces between the p-base layers 102 and the gate insulating films 107 disappear, and thus electrons stop being injected from the $n^+$-emitter layers 103 into the $n^-$-base layer 101. As a result, holes also stop being injected from the $p^+$-emitter layer 105 into the $n^-$-base layer 101. Then, carriers filling the $n^-$-base layer 101 are exhausted, and depletion layers expand from the junctions between the p-base layers 102 and the $n^-$-base layer 101 to bring the IGBT into an OFF-state.

During the turn-off operation, holes accumulated in the $n^-$-base layer 101 are exhausted through the p-base layers 102 into the emitter electrode 109, and through the $p^+$-ring layer 111 and the connection electrode 109b into the emitter electrode 109. In general, the $p^+$-ring layer 111 has a considerably large surface area, and a hole current concentrates at the contacting portion of the $p^+$-ring layer 111 with the connection electrode 109b. An excessive part of the hole current, which has not been allowed to flow through the contacting portion, mainly flows through the adjacent p-base layers 102. This current concentration gives rise to an increase in the potential of the p-base layers 102, and occasionally cause it to go beyond the junction potential (which is generally about 0.7V) between the p-base layers 102 and the $n^+$-emitter layers 103. In this case, the device falls in a latched-up state where electrons are directly injected from the $n^+$-emitter layers 103 into the $n^-$-base layer 101. As a result, electric current concentrates at the latched-up portion, thereby bringing about a thermal breakdown of the IGBT.

BRIEF SUMMARY OF THE INVENTION

According to a first aspect of the present invention, there is provided a high breakdown voltage semiconductor device including an active area, and a surrounding region surrounding the active area, comprising:

a first semiconductor layer of a first conductivity type disposed as a semiconductor active layer common to the active area and the surrounding region, the first semiconductor layer having first and second main surfaces opposite to each other;

a second semiconductor layer of a second conductivity type formed in the first main surface of the first semiconductor layer in the active area;

a third semiconductor layer of the first conductivity type formed in a surface of the second semiconductor layer;

a fourth semiconductor layer disposed on or in the second main surface of the first semiconductor layer in the active area;

a gate electrode facing, through a gate insulating film, a portion of the second semiconductor layer between the first semiconductor layer and the third semiconductor layer;

a first main electrode electrically connected to the second semiconductor layer and the third semiconductor layer;

a second main electrode electrically connected to the fourth semiconductor layer;

a ring layer of the second conductivity type formed in the first main surface of the first semiconductor layer and surrounding the active area at a position in the surrounding region adjacent to the active area;

a first low-resistivity layer formed in a surface of the ring layer and having a resistivity lower than that of the ring layer; and a connection electrode electrically connecting the first low-resistivity layer to the first main electrode.

According to a second aspect of the present invention, there is provided a high breakdown voltage semiconductor device including an active area, and a junction-termination region surrounding the active area, comprising:

a first semiconductor layer of a first conductivity type disposed as a semiconductor active layer common to the active area and the junction-termination region, the first semiconductor layer having first and second main surfaces opposite to each other;

a second semiconductor layer of a second conductivity type formed in the first main surface of the first semiconductor layer in the active area;

a third semiconductor layer of the first conductivity type formed in a surface of the second semiconductor layer;

a fourth semiconductor layer disposed on or in the second main surface of the first semiconductor layer in the active area;

a gate electrode facing, through a gate insulating film, a portion of the second semiconductor layer between the first semiconductor layer and the third semiconductor layer;

a first main electrode electrically connected to the second semiconductor layer and the third semiconductor layer;

a second main electrode electrically connected to the fourth semiconductor layer;

a ring layer of the second conductivity type formed in the first main surface of the first semiconductor layer and surrounding the active area at a position in the junction-termination region adjacent to the active area;

a first low-resistivity layer formed in a surface of the ring layer and having a resistivity lower than that of the ring layer;

a connection electrode electrically connecting the first low-resistivity layer to the first main electrode a second low-resistivity layer formed in a surface of the second semiconductor layer and having a resistivity lower than that of the second semiconductor layer, the second low-resistivity layer being disposed in contact with the first main electrode and the second and third semiconductor layers, the second low-resistivity layer consisting essentially of a material the same as that of the first low-resistivity layer;

an end layer of the first conductivity type formed in the first main surface of the first semiconductor layer along a peripheral edge of the first semiconductor layer in the junction-termination region, the end layer having a carrier impurity concentration higher than that of the first semiconductor layer; and a third low-resistivity layer formed in a surface of the end layer and having a resistivity lower than that of the end layer, the third low-resistivity layer consisting essentially of a material the same as that of the first low-resistivity layer.

DETAILED DESCRIPTION OF THE INVENTION

Figure 1:
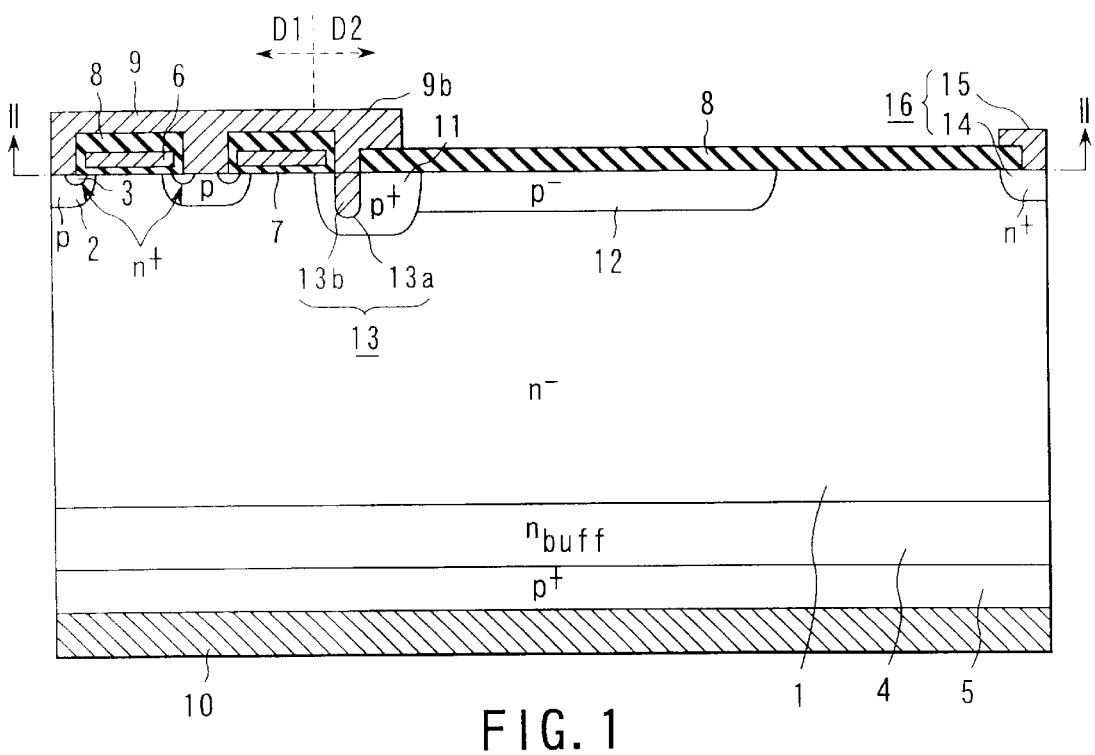
FIG. 1 is a sectional view schematically showing the junction-termination region and a portion of the active area near there, of an IGBT according to a first embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

In general, a high breakdown voltage semiconductor device has arrays of device unit cells, which are disposed in stripes, in the central area (corresponding to an active area) other than the peripheral region (corresponding to a junction-termination region) on a semiconductor substrate. In the following embodiments, for the sake of simplicity, the device will be partly explained, focusing on necessary portions. Furthermore, in the following description, the first conductivity type will be the n-type, while the second conductivity type will be the p-type.

First Embodiment

Figure 2:
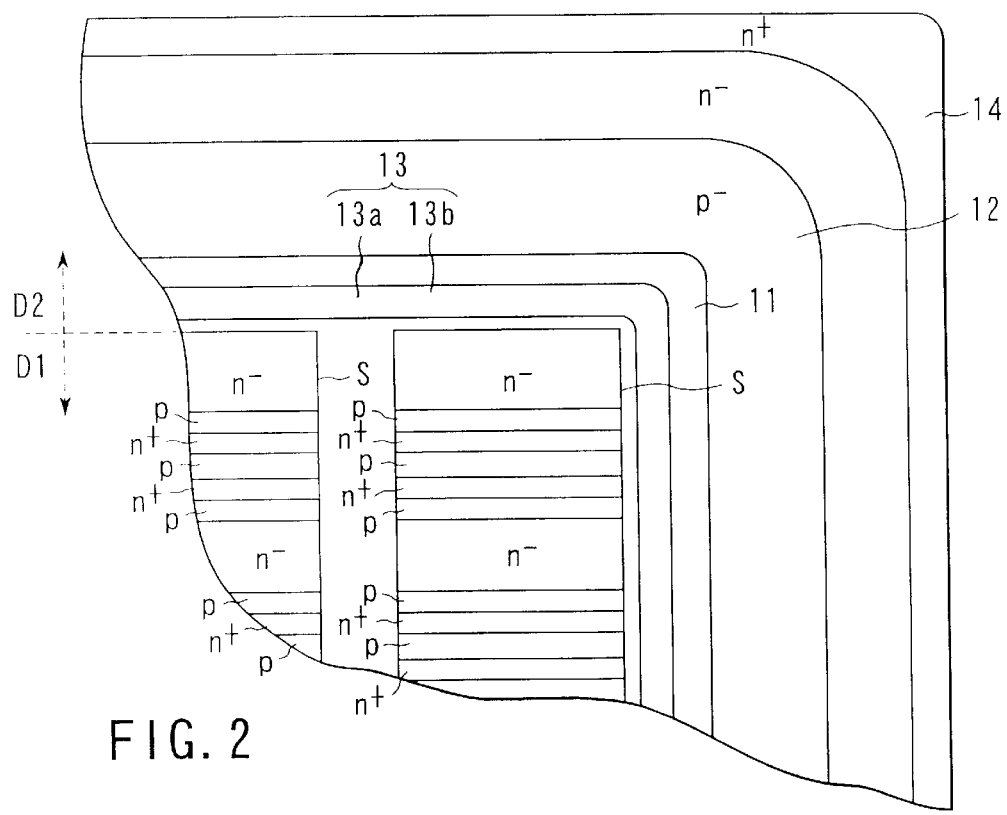
FIG. 2 is a plan view taken along line II—II in FIG. 1.

FIG. 1 is a sectional view schematically showing the junction-termination region and a portion of the active area near there, of an IGBT according to a first embodiment of the present invention. FIG. 2 is a plan view taken along line II—II in FIG. 1.

As shown in FIG. 1, an n⁻-base layer (a first base layer) 1 is disposed as a semiconductor active layer common to the central area (corresponding to an active area) D1, in which arrays of IGBT unit cells are disposed, and the peripheral region (corresponding to a junction-termination region) D2 surrounding the central area. The n⁻-base layer 1 has a first main surface (the top side) and a second main surface (the bottom side) opposite to each other. A plurality of p-base layers (second base layers) 2 are selectively formed in stripes by diffusion in the central area on the top side of the n⁻-base layer 1.

Two n⁺-emitter layers (first emitter layers) 3 are selectively formed in stripes by diffusion in each of the p-base layers 2. A gate electrode 6 is formed through a gate insulating film 7 on the portion between one of the n⁺-emitter layers 3 in one of each pair of two p-base layers 2, which are adjacent to each other, and one of the n⁺-emitter layers 3 in the other of the two p-base layers 2. A gate electrode 6 is also formed through a gate insulating film 7 on the portion between one of the n⁺-emitter layers 3 in each outermost p-base layer 2 and a p⁺-ring layer 11 described later.

An emitter electrode (a first main electrode) 9 is disposed in ohmic-contact with the p-base layers 2 and the n⁺-emitter layers 3 at respective positions on the p-base layers 2. The emitter electrode 9 is disposed on the gate electrodes 6 through an insulating protection film 8. A p⁺-emitter layer (a second emitter layer) 5 is formed through an n-buffer layer 4 on the bottom side of the n⁻-base layer 1. A collector electrode (a second main electrode) 10 is disposed in ohmic-contact with the p⁺-emitter layer 5.

As shown in FIG. 2, a p⁺-ring layer 11 is formed in the junction-termination region D2 and surrounds the central area (the active area) D1 in which the arrays S of IGBT unit cells are formed. The p⁺-ring layer 11 is electrically connected to the emitter electrode 9 through a connection electrode 9b, which is integral with the emitter electrode 9.

A ring-like n⁺-diffusion layer 14 is formed in the junction-termination region, along the peripheral edge thereof. The n⁺-diffusion layer 14 is of a conductivity type the same as that of the n⁻-base layer 1 and has a carrier impurity concentration higher than that of the n⁻-base layer 1. A ring-like stopper electrode 15 in an electrically floating state is disposed on the n⁺-diffusion layer 14. The n⁺-diffusion layer 14 and the stopper electrode 15 constitute an equipotential ring 16.

The surface of the n⁻-base layer 1 from the p⁺-ring layer 11 to the n⁺-diffusion layer 14 is covered with an insulating protection film 8. A p⁻-RESURF layer 12 is formed in the surface of the n⁻-base layer 1, disposed in contact with the p⁺-ring layer 11, and extends under the protection film 8 in the junction-termination region. The p⁻-RESURF layer 12 is of a conductivity type the same as that of the p⁺-ring layer 11 and has a carrier impurity concentration lower than that of p⁺-ring layer 11.

A ring-like low-resistivity layer 13 having a resistivity lower than that of the p⁺-ring layer 11 is formed in the surface of the layer 11. The low-resistivity layer 13 has a resistivity of from $1 \times 10^{-6}$ to $1 \times 10^{-3}$ Ω·cm and a depth of from 0.5 to 8 µm. The low-resistivity layer 13 is disposed on the active area side relative to the center of the p⁺-ring layer 11. The low-resistivity layer 13 is electrically connected to the emitter electrode 9 through the connection electrode 9b, which is integral with the emitter electrode 9. The low-resistivity layer 13 is made of a conductive material 13b buried in a trench 13a formed in the p⁺-ring layer 11.

As the conductive material 13b of the low-resistivity layer 13, a metal the same as that of the emitter electrode 9 and the connection electrode 9b, such as aluminum (Al) used in general, is preferably used, because its contact resistance with the emitter electrode is negligible. Where the conductive material 13b is the same as the material of the emitter electrode 9, the low-resistivity layer 13 can be formed along with the emitter electrode 9 in the same step by patterning a conductive film common to the emitter electrode 9. On the other hand, where it is necessary to consider a thermal treatment to be performed in a later step, a refractory metal, such as Mo, Ti, or W, is preferably used as the conductive material 13b. Furthermore, the conductive material 13b may consist of a semiconductor, such as polycrystalline silicon, which is of a conductivity type the same as that of the p$^+$-ring layer 11 and has a carrier impurity concentration higher than that of p$^+$-ring layer 11.

The low-resistivity layer 13 is disposed close to the pn junction between the n$^-$-base layer 1 and the p$^+$-ring layer 11. With this arrangement, a hole current concentrating at the p$^+$-ring layer 11 is allowed to swiftly flow into the emitter electrode 9. The low-resistivity layer 13 is partially disposed on the p-base layers 2 side relative to the center of the p$^+$-ring layer 11. With this arrangement, a smaller amount of hole current is allowed to flow into the p-base layers 2.

When the IGBT is turned on, the following operation is performed. Specifically, while a positive bias is applied between the collector electrode 10 and the emitter electrode 9 (the plus is on the collector electrode 10 side), a positive voltage (a positive bias) relative to the emitter electrode 9 is applied to the gate electrodes 6. By doing so, n-inversion layers (not shown) are formed near the interfaces between the p-base layers 2 and the gate insulating films 7, and thus electrons are injected from the n$^+$-emitter layers 3 into the n$^-$-base layer 1. In accordance with the injection amount of the electrons, holes are injected from the p$^+$-emitter layer 5 into the n$^-$-base layer 1. As a result, the n$^-$-base layer 1 is filled with carriers and causes a conductivity modulation, and thus the resistance of the n$^-$-base layer 1 decreases to bring the IGBT into an ON-state.

On the other hand, when the IGBT is turned off, the following operation is performed. Specifically, in the ON-state described above, a negative bias is applied to the gate electrodes 6. By doing so, the n-inversion layers near the interfaces between the p-base layers 2 and the gate insulating films 7 disappear, and thus electrons stop being injected from the n$^+$-emitter layers 3 into the n$^-$-base layer 1. As a result, holes also stop being injected from the p$^+$-emitter layer 5 into the n$^-$-base layer 1. Then, carriers filling the n$^-$-base layer 1 are exhausted, and depletion layers expand from the junctions between the p-base layers 2 and the n$^-$-base layer 1 to bring the IGBT into an OFF-state.

During the turn-off operation, holes accumulated in the n$^-$-base layer 1 are exhausted through the p$^+$-ring layer 11, the low-resistivity layer 13, and the connection electrode 9b into the emitter electrode 9, and through the p-base layers 2 into the emitter electrode 9. Since the low-resistivity layer 13 formed in the p$^+$-ring layer 11 allows holes to easily flow, a hole current concentrates at the p$^+$-ring layer 11 preferentially to the adjacent p-base layers 2. Consequently, the adjacent p-base layers 2 are prevented from increasing the potential, thereby improving the withstanding property of the IGBT against breakdown.

The distance from the pn junction between the p$^+$-ring layer 11 and the n$^-$-base layer 1 to the low-resistivity layer 13 is set to be a distance at which a depletion layer extends from the pn junction into the p$^+$-ring layer 11 when the IGBT is statically withstanding in an OFF-state. With this arrangement, the low-resistivity layer 13 can be utilized as a protection mechanism when the IGBT is supplied with an excessive voltage.

Second Embodiment

Figure 3:
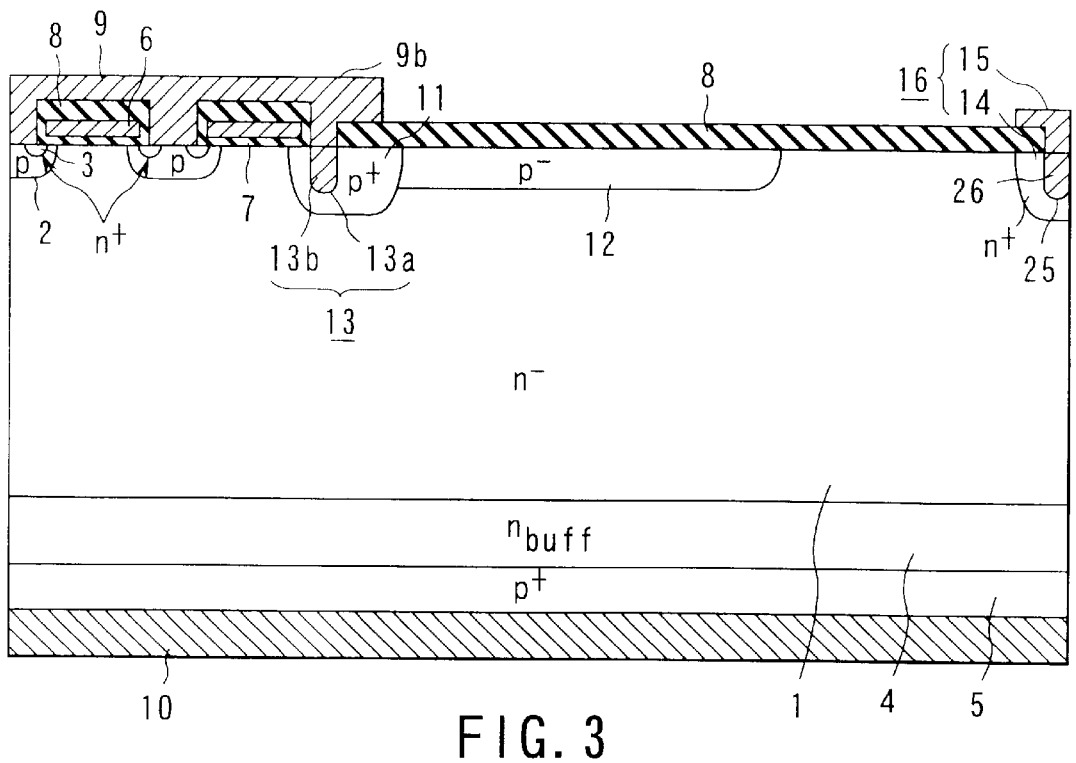
FIG. 3 is a sectional view schematically showing the junction-termination region and a portion of the active area near there, of an IGBT according to a second embodiment of the present invention.

FIG. 3 is a sectional view schematically showing the junction-termination region and a portion of the active area near there, of an IGBT according to a second embodiment of the present invention.

In this embodiment, the structure of the first embodiment is modified such that a ring-like low-resistivity layer 26 having a resistivity lower than that of an n$^+$-diffusion layer 14 is formed in the surface of the layer 14. The low-resistivity layer 26 is disposed in a trench 25 formed in the n$^+$-diffusion layer 14. The trench 25 may have a depth substantially the same as that of a trench 13a formed in a p$^+$-ring layer 11. The low-resistivity layer 26 is electrically connected to a stopper electrode 15. The low-resistivity layer 26 functions to stabilize the potential of the n$^+$-diffusion layer 14.

Similarly to a low-resistivity layer 13 in the p$^+$-ring layer 11, the low-resistivity layer 26 is made of an ordinary wiring metal, a refractory metal, or a semiconductor. Where the low-resistivity layer 26 is formed along with the low-resistivity layer 13 in the same step, the number of manufacturing steps is prevented from increasing. In this case, the low-resistivity layer 26 is made of a material substantially the same as that of the low-resistivity layer 13. Particularly, where the low-resistivity layer 26, as well as the low-resistivity layer 13, is made of a material the same as that of the emitter electrode 9, the low-resistivity layer 26, as well as the low-resistivity layer 13, can be formed along with the emitter electrode 9 in the same step by patterning a conductive film common to the emitter electrode 9.

Third Embodiment

Figure 4:
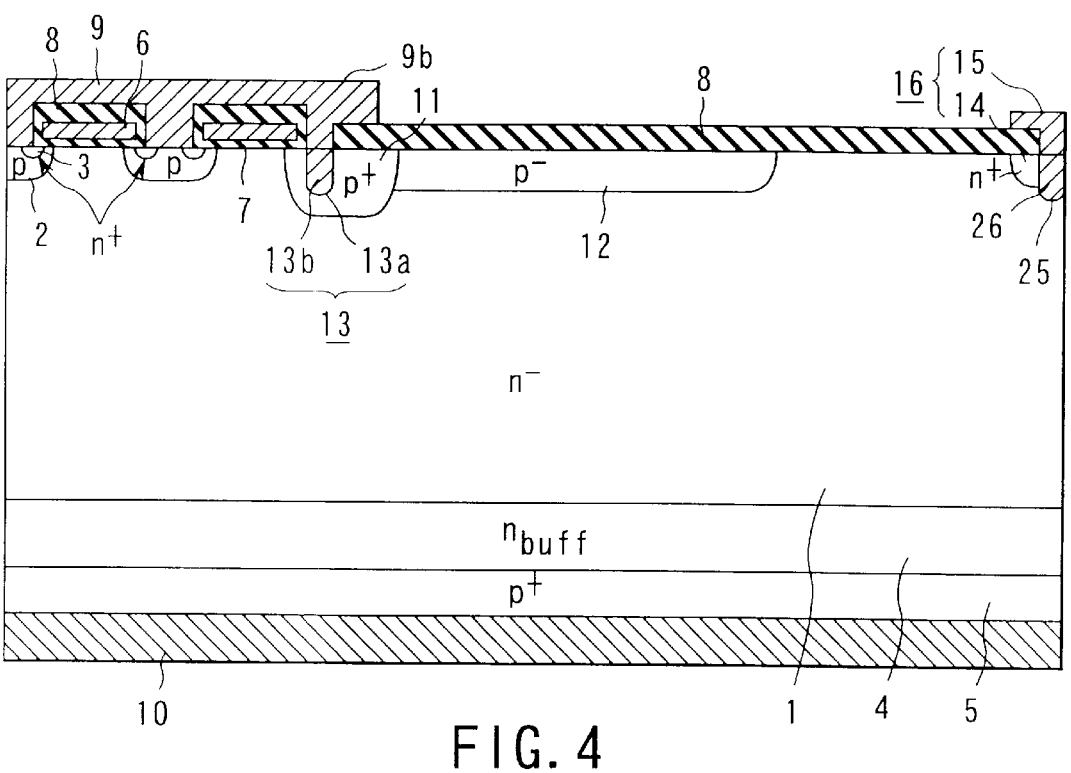
FIG. 4 is a sectional view schematically showing the junction-termination region and a portion of the active area near there, of an IGBT according to a third embodiment of the present invention.

FIG. 4 is a sectional view schematically showing the junction-termination region and a portion of the active area near there, of an IGBT according to a third embodiment of the present invention.

In this embodiment, the structure of the second embodiment is modified such that a low-resistivity layer 26 penetrates an n$^+$-diffusion layer 14 and extends into an n$^-$-base layer 1. In this case, the low-resistivity layer 26 prevents depletion layers from expanding to the outside of the n$^+$-diffusion layer 14, when the depletion layers expand from the junctions between p-base layers 2 and the n$^-$-base layer 1 and reach the n$^+$-diffusion layer 14 in an OFF-state of IGBT. As a result, the breakdown voltage of the IGBT is improved. Furthermore, since the n$^+$-emitter layers 3 and the n$^+$-diffusion layer 14 can be formed at the same time, the number of manufacturing steps is prevented from increasing. The relationship between the n$^+$-diffusion layer 14 and the low-resistivity layer 26 shown in FIG. 4 is applicable to the following embodiments in the same manner.

Fourth Embodiment

Figure 5:
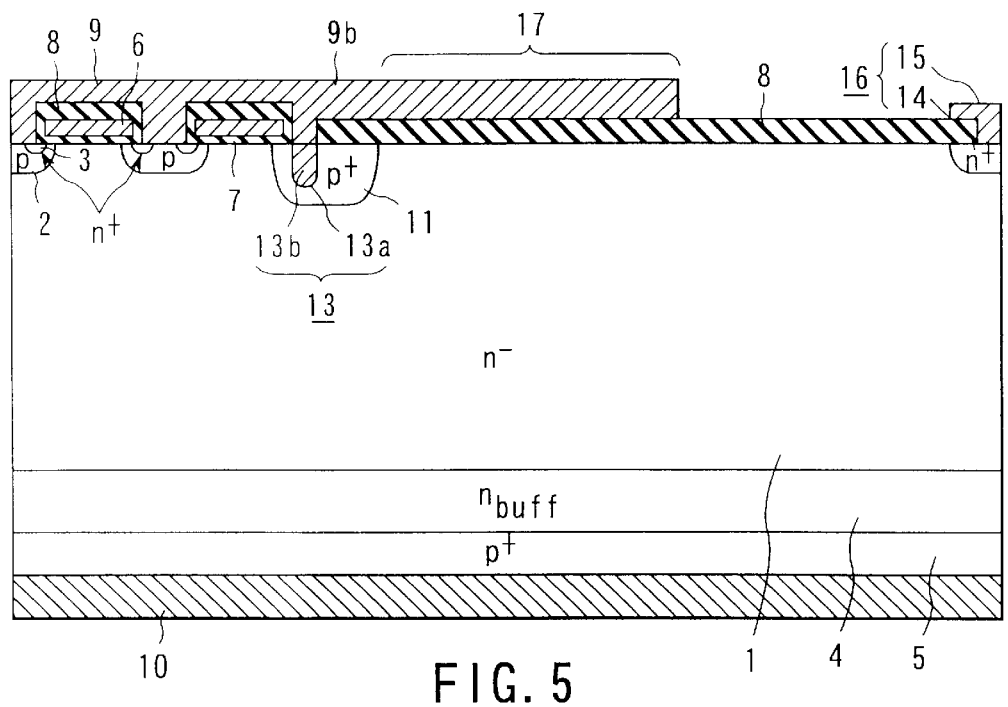
FIG. 5 is a sectional view schematically showing the junction-termination region and a portion of the active area near there, of an IGBT according to a fourth embodiment of the present invention.

FIG. 5 is a sectional view schematically showing the junction-termination region and a portion of the active area near there, of an IGBT according to a fourth embodiment of the present invention.

In this embodiment, the structure of the first embodiment is modified such that a conductive field plate 17 is used in place of the p$^-$-RESURF layer 12. The field plate 17 extends on top of a protection film 8 in the junction-termination region. The field plate 17 is electrically connected to a low-resistivity layer 13 and an emitter electrode 9.

Also in this embodiment, the low-resistivity layer 13 formed in a p$^+$-ring layer 11 improves the withstanding property of the IGBT against breakdown. The field plate 17 functions to laterally expand an equi-potential plane in an OFF-state, thereby relaxing electrical field concentration to improve the breakdown voltage.

Fifth Embodiment

Figure 6:
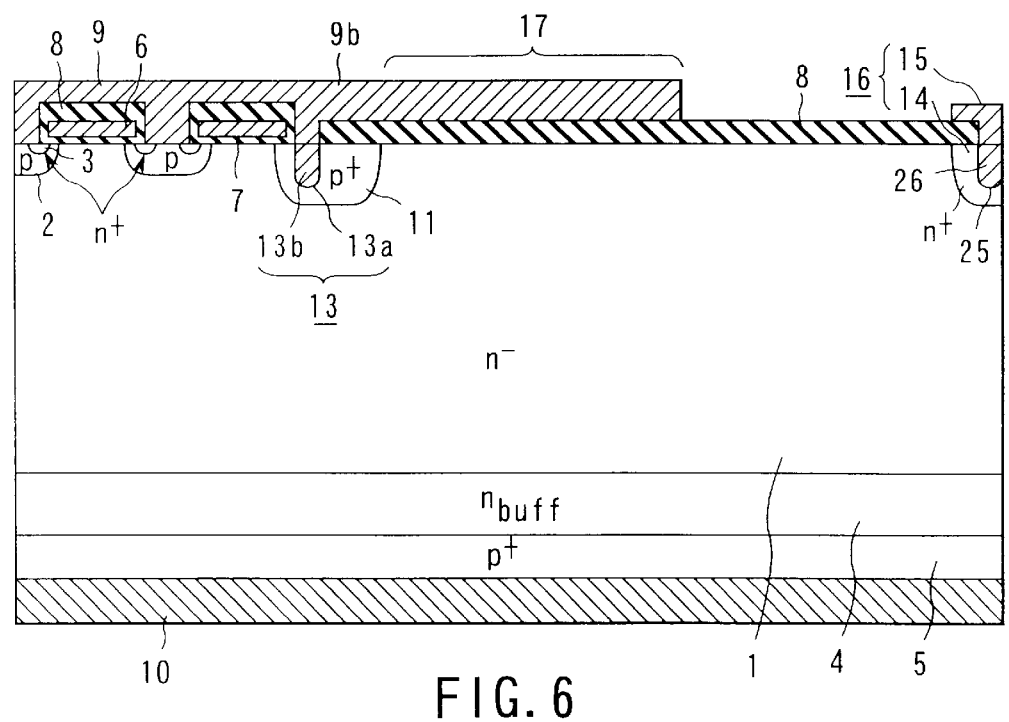
FIG. 6 is a sectional view schematically showing the junction-termination region and a portion of the active area near there, of an IGBT according to a fifth embodiment of the present invention.

FIG. 6 is a sectional view schematically showing the junction-termination region and a portion of the active area near there, of an IGBT according to a fifth embodiment of the present invention.

In this embodiment, the structure of the fourth embodiment is modified such that a ring-like low-resistivity layer 26 having a resistivity lower than that of an n$^+$-diffusion layer 14 is formed in the surface of the layer 14. The low-resistivity layer 26 is disposed in a trench 25 formed in the n$^+$-diffusion layer 14. The low-resistivity layer 26 is electrically connected to a stopper electrode 15. The function and manufacturing method of the low-resistivity layer 26 have been explained with reference to FIG. 3.

Sixth Embodiment

Figure 7:
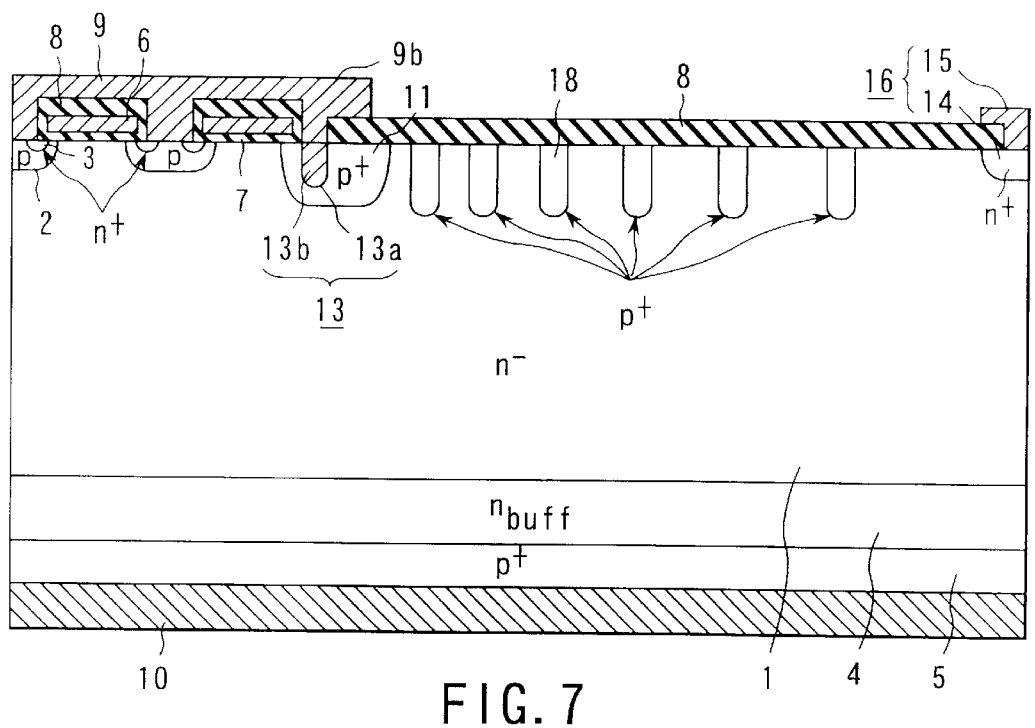
FIG. 7 is a sectional view schematically showing the junction-termination region and a portion of the active area near there, of an IGBT according to a sixth embodiment of the present invention.

FIG. 7 is a sectional view schematically showing the junction-termination region and a portion of the active area near there, of an IGBT according to a sixth embodiment of the present invention.

In this embodiment, the structure of the first embodiment is modified such that a plurality of p$^+$-guard ring layers 18 are used in place of the p$^-$-RESURF layer 12. The p$^+$-guard ring layers 18 are formed in the surface of an n$^-$-base layer 1 between a p$^+$-ring layer 11 and an n$^+$-diffusion layer 14. The p$^+$-guard ring layers 18 are of a conductivity type the same as that of the p$^+$-ring layer 11 and have a carrier impurity concentration higher than that of the p$^+$-ring layer 11. The distances between the p$^+$-guard ring layers 18 become gradually larger toward the peripheral edge.

Also in this embodiment, a low-resistivity layer 13 formed in the p$^+$-ring layer 11 improves the withstanding property of the IGBT against breakdown. The p$^+$-guard ring layers 18 cause the potential to gradually increase from the p$^+$-ring layer 11 to an equi-potential ring 16 in an OFF-state of the IGBT. In other words, the p$^+$-guard ring layers 18 function to laterally expand an equi-potential plane in an OFF-state, thereby relaxing electrical field concentration to improve the breakdown voltage. The breakdown voltage can be controlled by changing the number of the p$^+$-guard ring layers 18.

Seventh Embodiment

Figure 8:
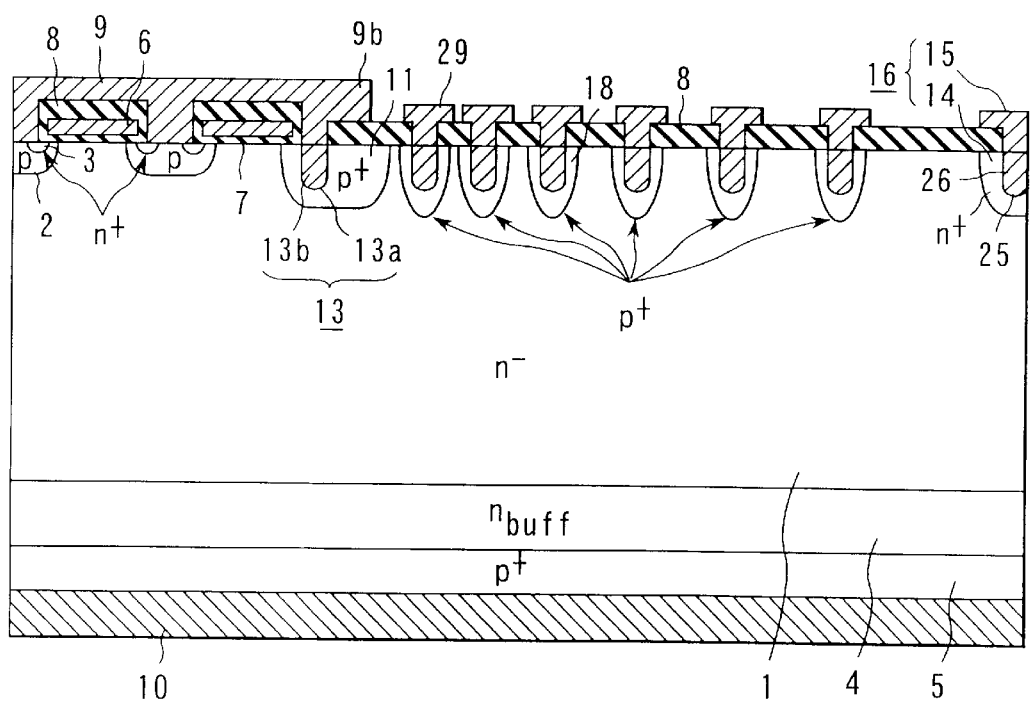
FIG. 8 is a sectional view schematically showing the junction-termination region and a portion of the active area near there, of an IGBT according to a seventh embodiment of the present invention.

FIG. 8 is a sectional view schematically showing the junction-termination region and a portion of the active area near there, of an IGBT according to a seventh embodiment of the present invention.

In this embodiment, the structure of the sixth embodiment is modified such that a ring-like low-resistivity layer 26 having a resistivity lower than that of an n$^+$-diffusion layer 14 is formed in the surface of the layer 14. The low-resistivity layer 26 is disposed in a trench 25 formed in the n$^+$-diffusion layer 14. The low-resistivity layer 26 is electrically connected to a stopper electrode 15. The function and manufacturing method of the low-resistivity layer 26 have been explained with reference to FIG. 3.

Also, ring-like low-resistivity layers 28 having a resistivity lower than that of p$^+$-guard ring layers 18 are respectively formed in the surfaces of the layers 18. The low-resistivity layers 28 are disposed in trenches 27 formed in the p$^+$-guard ring layers 18. The trenches 27 may have a depth substantially the same as that of a trench 13a formed in a p$^+$-ring layer 11. The low-resistivity layers 28 are electrically connected to guard ring electrodes 29 disposed thereon in an electrically floating state. The guard ring electrodes 29 and the low-resistivity layers 28 function to stabilize the potentials of the p$^+$-guard ring layers 18.

Similarly to a low-resistivity layer 13 in the p$^+$-ring layer 11, the low-resistivity layers 28 are made of an ordinary wiring metal, a refractory metal, or a semiconductor. Where the low-resistivity layers 28 are formed along with the low-resistivity layer 13 in the same step, the number of manufacturing steps is prevented from increasing. In this case, the low-resistivity layers 28 are made of a material substantially the same as that of the low-resistivity layer 13. Particularly, where the guard ring electrodes 29 and the low-resistivity layers 28, as well as the low-resistivity layers 13 and 26, are made of a material the same as that of the emitter electrode 9, the guard ring electrodes 29 and the low-resistivity layers 28, as well as the low-resistivity layers 13 and 26, can be formed along with the emitter electrode 9 in the same step by patterning a conductive film common to the emitter electrode 9.

Eighth Embodiment

Figure 9:
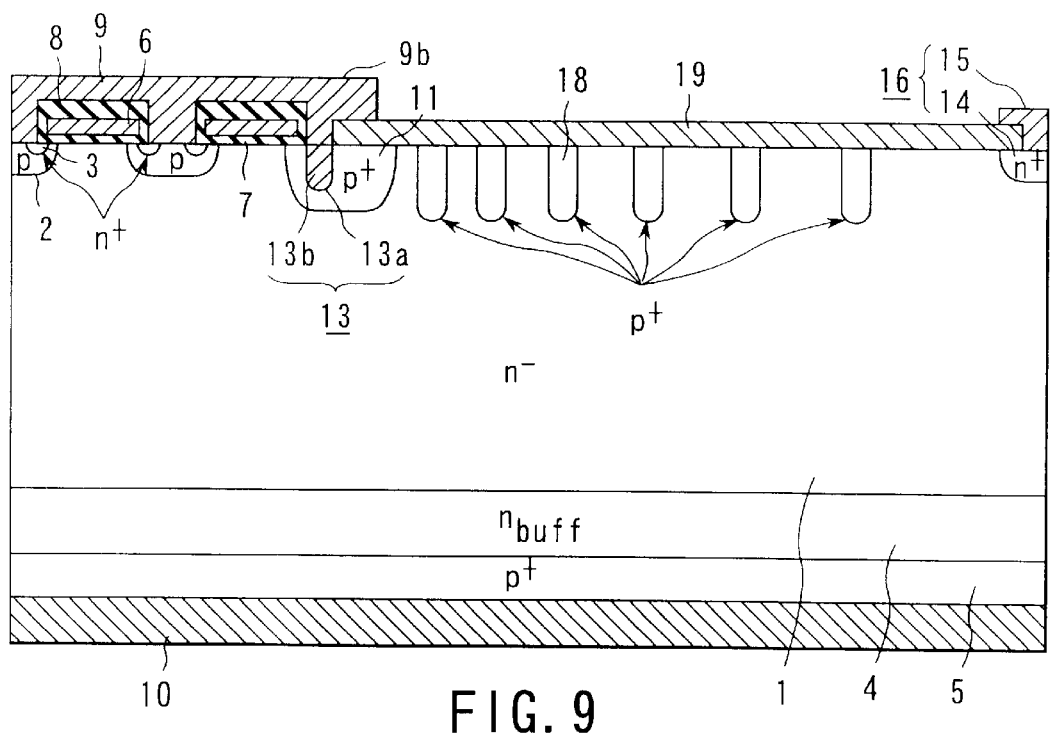
FIG. 9 is a sectional view schematically showing the junction-termination region and a portion of the active area near there, of an IGBT according to an eighth embodiment of the present invention.

FIG. 9 is a sectional view schematically showing the junction-termination region and a portion of the active area near there, of an IGBT according to an eighth embodiment of the present invention.

In this embodiment, the structure of the sixth embodiment is modified such that a protection film 19 made of a semi-insulating material (a high resistivity material) is formed in place of the protection film (an oxide film) 8 made of an insulating material. The protection film 19 consists of, e.g., SIPOS (Semi-Insulating Polycrystalline Silicon).

Also in this embodiment, a low-resistivity layer 13 formed in a p$^+$-ring layer 11 improves the withstanding property of the IGBT against breakdown. The protection film 19 makes the device less sensitive to the influence of electrical charges outside the IGBT, thereby preventing the breakdown voltage of the IGBT from lowering.

Ninth Embodiment

Figure 10:
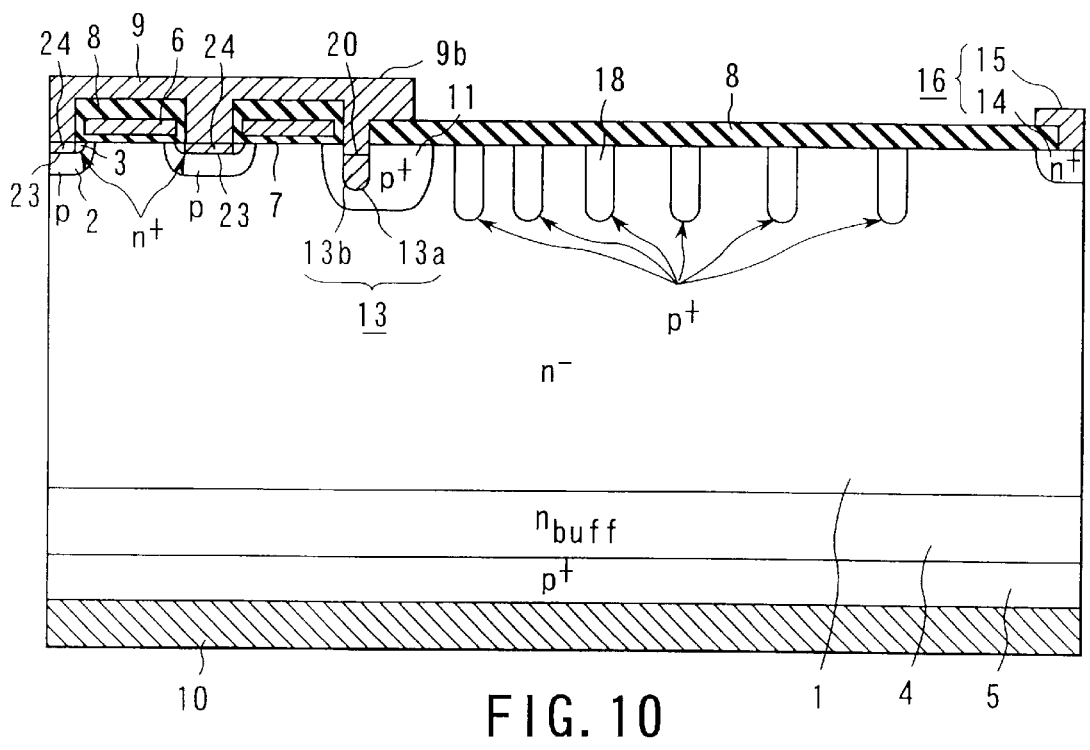
FIG. 10 is a sectional view schematically showing the junction-termination region and a portion of the active area near there, of an IGBT according to a ninth embodiment of the present invention.

FIG. 10 is a sectional view schematically showing the junction-termination region and a portion of the active area near there, of an IGBT according to a ninth embodiment of the present invention.

In this embodiment, the structure of the sixth embodiment is modified such that ring-like low-resistivity layers 24 having a resistivity lower than that of p-base layers 2 are respectively formed in the surfaces of the layers 2. The low-resistivity layers 24 are disposed in trenches 23 formed in the p-base layers 2. The low-resistivity layers 24 are disposed in contact with an emitter electrode 9, the p-base layers 2, and n$^+$-emitter layers 3. A trench 20 is formed above a low-resistivity layer 13 in a p$^+$-ring layer 11. The trenches 20 and 23 are formed by etching to have a depth of, e.g., about 1.0 $\mu$m.

Similarly to the low-resistivity layer 13 in the p$^+$-ring layer 11, the low-resistivity layers 24 are made of an ordinary wiring metal, a refractory metal, or a semiconductor. Where the low-resistivity layers 24 are formed along with the low-resistivity layer 13 in the same step, the number of manufacturing steps is prevented from increasing. In this case, the low-resistivity layers 24 are made of a material substantially the same as that of the low-resistivity layer 13. Particularly, where the low-resistivity layers 24, as well as the low-resistivity layer 13, are made of a material the same as that of the emitter electrode 9, the low-resistivity layers 24, as well as the low-resistivity layer 13, can be formed along with the emitter electrode 9 in the same step by patterning a conductive film common to the emitter electrode 9.

Also in this embodiment, the low-resistivity layer 13 formed in the p$^+$-ring layer 11 improves the withstanding property of the IGBT against breakdown. The p-base layers 2 are connected to the emitter electrode 9 through the low-resistivity layers 24 disposed in the trenches 23, thereby improving the contacting property. In addition, since the distance between an n⁻-base layer 1 and the emitter electrode 9 is reduced and the lateral resistance of the p-base layers 2 decreases, the current value at which a latched-up state is brought about is raised. In other words, this arrangement further improves the withstanding property against a latched-up state.

Tenth Embodiment

Figure 11:
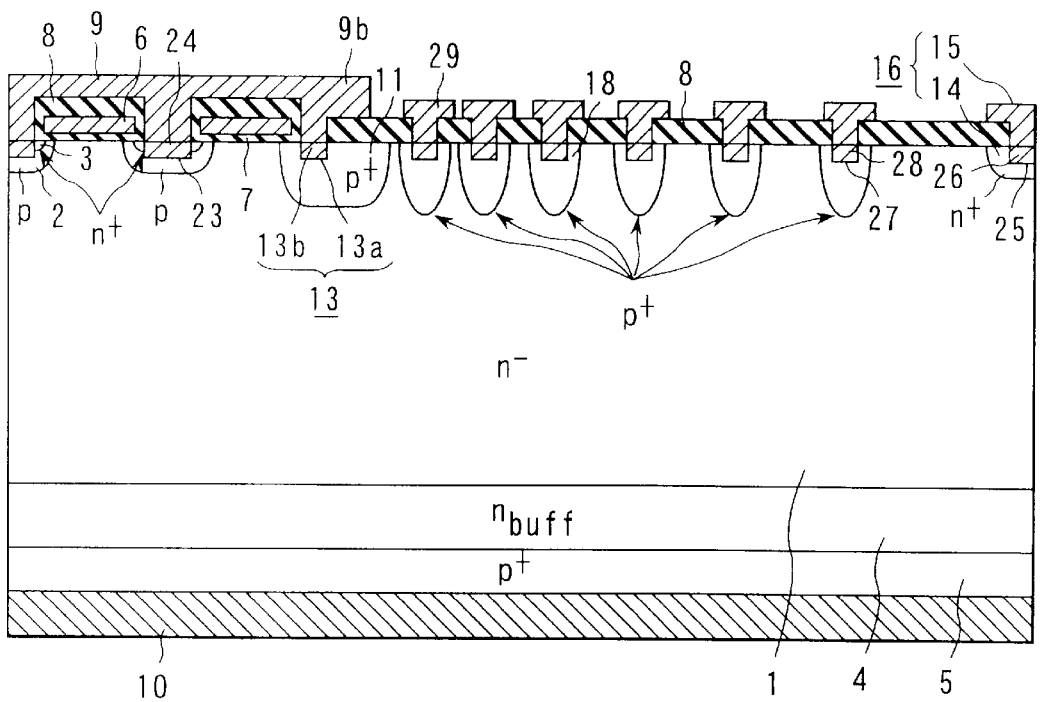
FIG. 11 is a sectional view schematically showing the junction-termination region and a portion of the active area near there, of an IGBT according to a tenth embodiment of the present invention.

FIG. 11 is a sectional view schematically showing the junction-termination region and a portion of the active area near there, of an IGBT according to a tenth embodiment of the present invention.

In this embodiment, the structure of the ninth embodiment is modified such that a ring-like low-resistivity layer 26 having a resistivity lower than that of an n⁺-diffusion layer 14 is formed in the surface of the layer 14. The low-resistivity layer 26 is disposed in a trench 25 formed in the n⁺-diffusion layer 14. The low-resistivity layer 26 is electrically connected to a stopper electrode 15. The function and manufacturing method of the low-resistivity layer 26 have been explained with reference to FIG. 3.

Also, ring-like low-resistivity layers 28 having a resistivity lower than that of p⁺-guard ring layers 18 are respectively formed in the surfaces of the layers 18. The low-resistivity layers 28 are disposed in trenches 27 formed in the p⁺-guard ring layers 18. The low-resistivity layers 28 are electrically connected to guard ring electrodes 29 disposed thereon in an electrically floating state. The function and manufacturing method of the low-resistivity layers 28 have been explained with reference to FIG. 8.

A low-resistivity layer 13 formed in a p⁺-ring layer 11, low-resistivity layers 24 formed in p-base layers 2, the low-resistivity layer 26 formed in the n⁺-diffusion layer 14, and the low-resistivity layers 28 formed in the p⁺-guard ring layers 18 are made of substantially the same material. Particularly, where the low-resistivity layers 13, 24, 26, and 28 are made of a material the same as that of the emitter electrode 9, these low-resistivity layers can be formed along with the emitter electrode 9 in the same step by patterning a conductive film common to the emitter electrode 9. The trenches 13a, 23, 25, and 27 accommodating the low-resistivity layers 13, 24, 26, and 28 may have substantially the same depth.

Eleventh Embodiment

Figure 12:
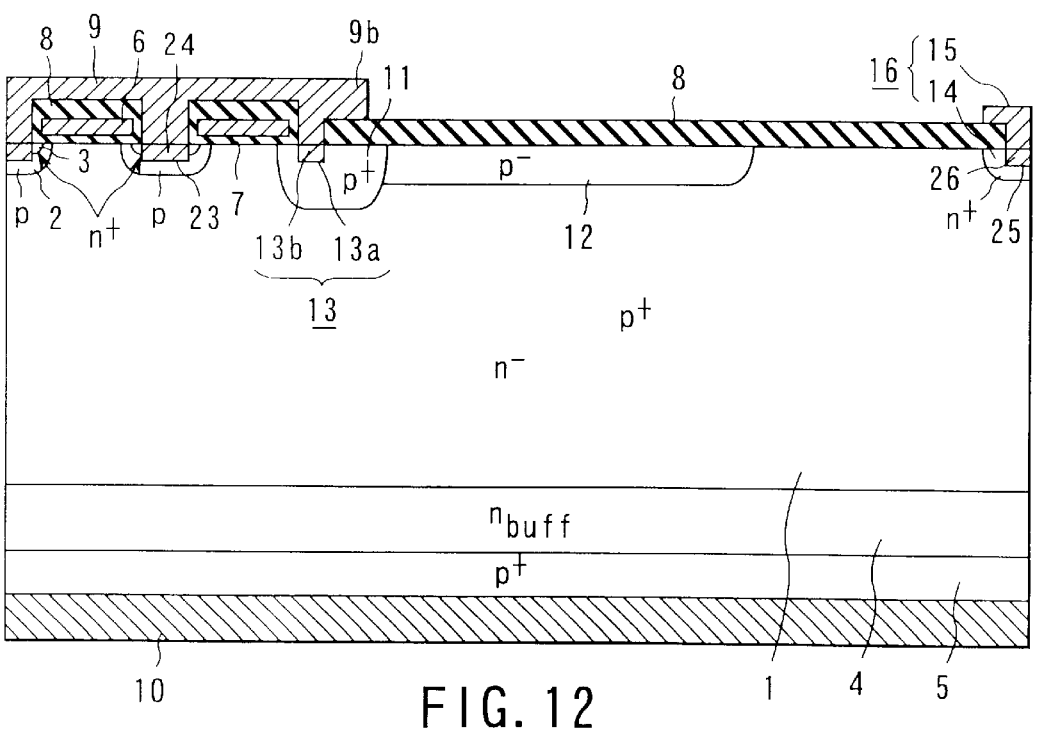
FIG. 12 is a sectional view schematically showing the junction-termination region and a portion of the active area near there, of an IGBT according to an eleventh embodiment of the present invention.

FIG. 12 is a sectional view schematically showing the junction-termination region and a portion of the active area near there, of an IGBT according to an eleventh embodiment of the present invention.

In this embodiment, the structure of the tenth embodiment is modified such that a p⁻-RESURF layer 12 is formed in the surface of an n⁻-base layer 1 in place of the p⁺-guard ring layers 18. The p⁻-RESURF layer 12 is formed in contact with a p⁺-ring layer 11 and extends under the protection film 8 in the junction-termination region. The p⁻-RESURF layer 12 functions to laterally expand an equi-potential plane in an OFF-state, thereby relaxing electrical field concentration to improve the breakdown voltage.

Twelfth Embodiment

Figure 13:
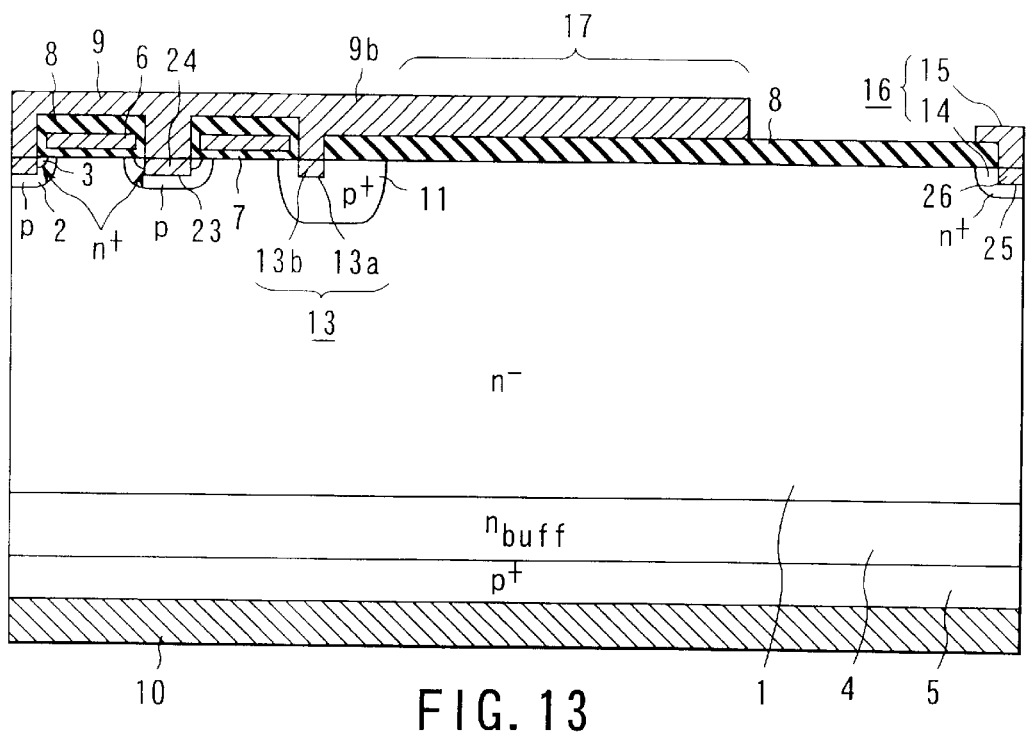
FIG. 13 is a sectional view schematically showing the junction-termination region and a portion of the active area near there, of an IGBT according to a twelfth embodiment of the present invention.

FIG. 13 is a sectional view schematically showing the junction-termination region and a portion of the active area near there, of an IGBT according to a twelfth embodiment of the present invention.

In this embodiment, the structure of the tenth embodiment is modified such that a conductive field plate 17 is used in place of the p⁺-guard ring layers 18. The field plate 17 extends on top of a protection film 8 in the junction-termination region. The field plate 17 is electrically connected to a low-resistivity layer 13 and an emitter electrode 9. The field plate 17 functions to laterally expand an equi-potential plane in an OFF-state, thereby relaxing electrical field concentration to improve the breakdown voltage.

Thirteenth Embodiment

Figure 14:
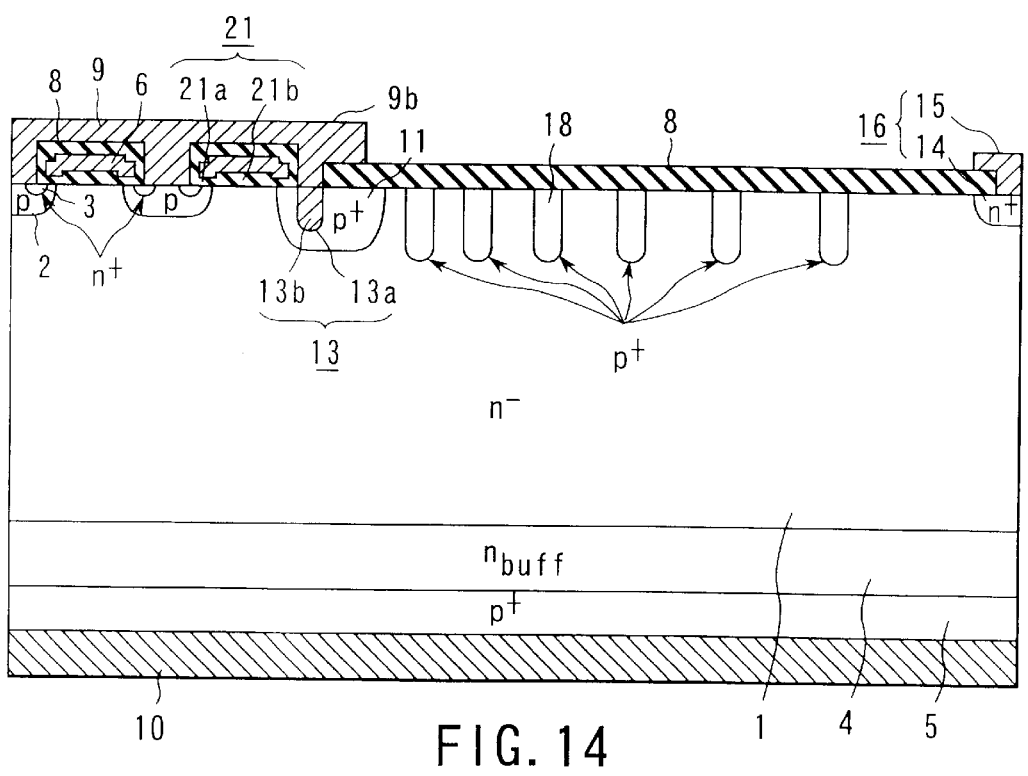
FIG. 14 is a sectional view schematically showing the junction-termination region and a portion of the active area near there, of an IGBT according to a thirteenth embodiment of the present invention.

FIG. 14 is a sectional view schematically showing the junction-termination region and a portion of the active area near there, of an IGBT according to a thirteenth embodiment of the present invention.

In this embodiment, the structure of the sixth embodiment is modified such that each of gate insulating films 21 is formed of first and second portions 21a and 21b having thicknesses different from each other. The first portions 21a of each gate insulating film 21 have a smaller thickness and are located on the portions of the corresponding p-base layer 2 (the channel region) between an n⁻-base layer 1 and the n⁺-emitter layers 3. The other portion of each gate insulating film 21 (the second portion 21b) has a larger thickness.

Also in this embodiment, a low-resistivity layer 13 formed in a p⁺-ring layer 11 improves the withstanding property of the IGBT against breakdown. Since each gate insulating film 21 has a large thickness at a portion other than the channel region, the capacitance between the gate and the collector decreases. Consequently, the IGBT can operate more uniformly at a higher speed. The structure of the gate insulating films 21 is applicable to the first to twelfth embodiments described above, and eighteenth and nineteenth embodiments described later.

Fourteenth Embodiment

Figure 15:
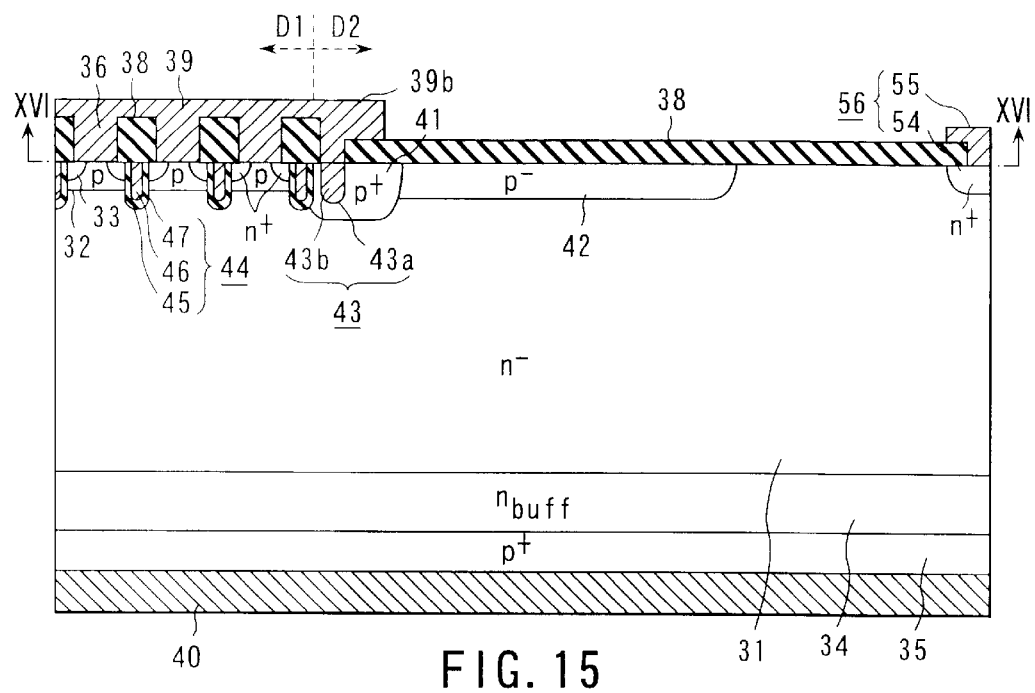
FIG. 15 is a sectional view schematically showing the junction-termination region and a portion of the active area near there, of an IGBT according to a fourteenth embodiment of the present invention.
Figure 16:
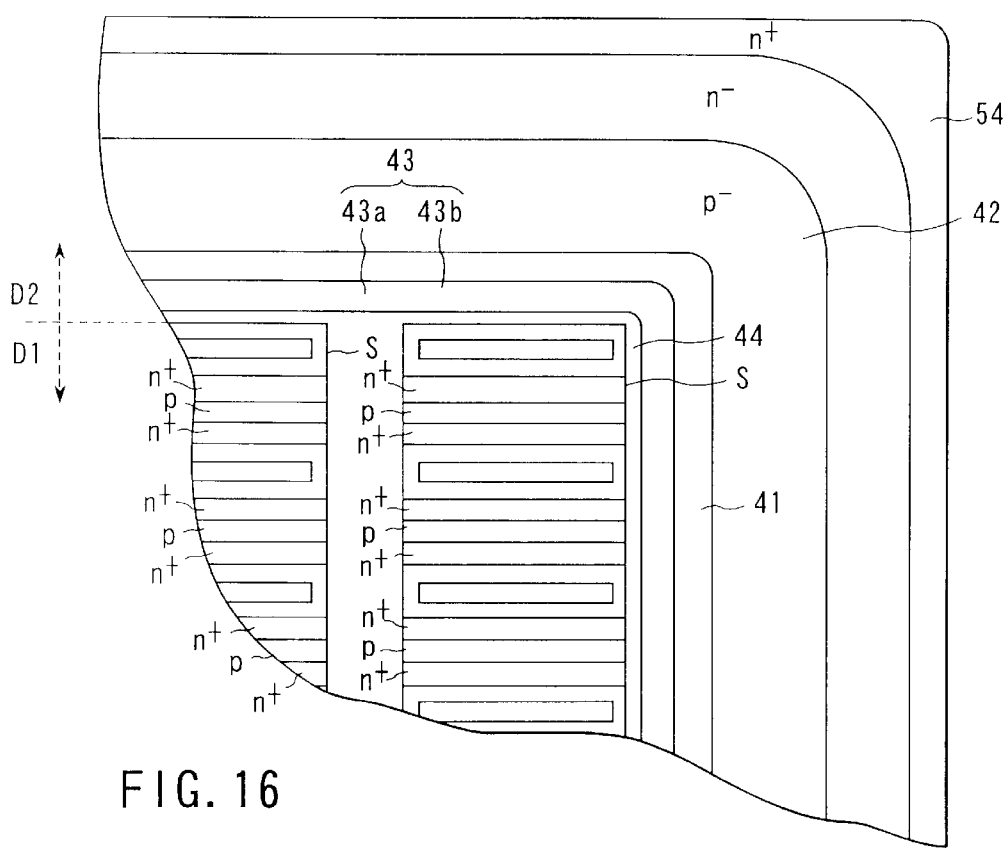
FIG. 16 is a plan view taken along line XVI—XVI in FIG. 15.

FIG. 15 is a sectional view schematically showing the junction-termination region and a portion of the active area near there, of an IGBT according to a fourteenth embodiment of the present invention. FIG. 16 is a plan view taken along line XVI—XVI in FIG. 15. This IGBT has a structure of the trench gate type.

As shown in FIG. 15, an n⁻-base layer (a first base layer) 31 is disposed as a semiconductor active layer common to the central area (corresponding to an active area) D1, in which arrays of IGBT unit cells are disposed, and the peripheral region (corresponding to a junction-termination region) D2 surrounding the central area. The n⁻-base layer 31 has a first main surface (the top side) and a second main surface (the bottom side) opposite to each other. A plurality of p-base layers (second base layers) 32 are selectively formed in stripes by diffusion in the central area on the top side of the n⁻-base layer 31.

A plurality of trenches 45 are formed in the n⁻-base layer 31 and the p-base layers 32, such that they penetrate the p-base layers 32 and extend into the n⁻-base layer 31 halfway. A gate electrode 46 is formed and buried through a gate insulating film 47 in each of the trenches 45. The combination of the trench 45, the gate insulating film 47, and the gate electrode 46 constitutes a trench gate 44. N⁺-emitter layers (first emitter layers) 33 are selectively formed in contact with sides of the trench gates 44 by diffusion in the surfaces of the p-base layers 32.

An emitter electrode (a first main electrode) 39 is disposed in ohmic-contact with the p-base layers 32 and the n⁺-emitter layers 33 at respective positions in the gaps between the trench gates 44. The emitter electrode 39 is disposed on the gate electrodes 46 through an insulating protection film 38. A p⁺-emitter layer (a second emitter layer) 35 is formed through an n-buffer layer 34 on the bottom side of the n⁻-base layer 31. A collector electrode (a second main electrode) 40 is disposed in ohmic-contact with the p⁺-emitter layer 35.

As shown in FIG. 16, a p⁺-ring layer 41 is formed in the junction-termination region D2 and surrounds the central area (the active area) D1 in which the arrays S of IGBT unit cells are formed. The p⁺-ring layer 41 is disposed in contact with the outermost trench gates 44. The p⁺-ring layer 41 is electrically connected to the emitter electrode 39 through a connection electrode 39b, which is integral with the emitter electrode 39.

A ring-like n⁺-diffusion layer 54 is formed in the junction-termination region, along the peripheral edge thereof. The n⁺-diffusion layer 54 is of a conductivity type the same as that of the n⁻-base layer 31 and has a carrier impurity concentration higher than that of the n⁻-base layer 31. A ring-like stopper electrode 55 in an electrically floating state is disposed on the n⁺-diffusion layer 54. The n⁺-diffusion layer 54 and the stopper electrode 55 constitute an equipotential ring 56.

The surface of the n⁻-base layer 31 from the p⁺-ring layer 41 to the n⁺-diffusion layer 54 is covered with an insulating protection film 38. A p⁻-RESURF layer 42 is formed in the surface of the n⁻-base layer 31, disposed in contact with the p⁺-ring layer 41, and extends under the protection film 38 in the junction-termination region. The p⁻-RESURF layer 42 is of a conductivity type the same as that of the p⁺-ring layer 41 and has a carrier impurity concentration lower than that of p⁺-ring layer 41.

A ring-like low-resistivity layer 43 having a resistivity lower than that of the p⁺-ring layer 41 is formed in the surface of the layer 41. The low-resistivity layer 43 has a resistivity of from $1 \times 10^{-6}$ to $1 \times 10^{-3}$ Ω·cm and a depth of from 0.5 to 8 μm. The low-resistivity layer 43 is disposed on the active area side relative to the center of the p⁺-ring layer 41. The low-resistivity layer 43 is electrically connected to the emitter electrode 39 through the connection electrode 39b, which is integral with the emitter electrode 39. The low-resistivity layer 43 is made of a conductive material 43b buried in a trench 43a formed in the p⁺-ring layer 41.

As the conductive material 43b of the low-resistivity layer 43, a metal the same as that of the emitter electrode 39 and the connection electrode 39b, such as aluminum (Al) used in general, is preferably used, because its contact resistance with the emitter electrode is negligible. Where the conductive material 43b is the same as the material of the emitter electrode 39, the low-resistivity layer 43 can be formed along with the emitter electrode 39 in the same step by patterning a conductive film common to the emitter electrode 39. On the other hand, where it is necessary to consider a thermal treatment to be performed in a later step, a refractory metal, such as Mo, Ti, or W, is preferably used as the conductive material 43b. Furthermore, the conductive material 43b may consist of a semiconductor, such as polycrystalline silicon, which is of a conductivity type the same as that of the p⁺-ring layer 41 and has a carrier impurity concentration higher than that of p⁺-ring layer 41.

The low-resistivity layer 43 is disposed close to the pn junction between the n⁻-base layer 31 and the p⁺-ring layer 41. With this arrangement, a hole current concentrating at the p⁺-ring layer 41 is allowed to swiftly flow into the emitter electrode 39. The low-resistivity layer 43 is partially disposed on the p-base layers 32 side relative to the center of the p⁺-ring layer 41. With this arrangement, a smaller amount of hole current is allowed to flow into the p-base layers 32.

The operation of the IGBT of the trench gate type according to this embodiment is the same as that of the IGBT according to the first embodiment, and thus a description thereof will be omitted.

During the turn-off operation, holes accumulated in the n⁻-base layer 31 are exhausted through the p⁺-ring layer 41, the low-resistivity layer 43, and the connection electrode 39b into the emitter electrode 39, and through the p-base layers 32 into the emitter electrode 39. Since the low-resistivity layer 43 formed in the p⁺-ring layer 41 allows holes to easily flow, a hole current concentrates at the p⁺-ring layer 41 preferentially to the adjacent p-base layers 32. Consequently, the adjacent p-base layers 32 are prevented from increasing the potential, thereby improving the withstanding property of the IGBT against breakdown.

Where the intervals between trenches 45 are small, the gaps between the trenches 45 form current passageways narrow enough to increase resistance against the flow of holes from the n⁻-base layer 31 toward the emitter electrode 39 in an ON-state of the IGBT. With this arrangement, it is possible to increase the ability to inject electrons from n⁺-emitter layers 33 into the n⁻-base layer 31.

Fifteenth Embodiment

Figure 17:
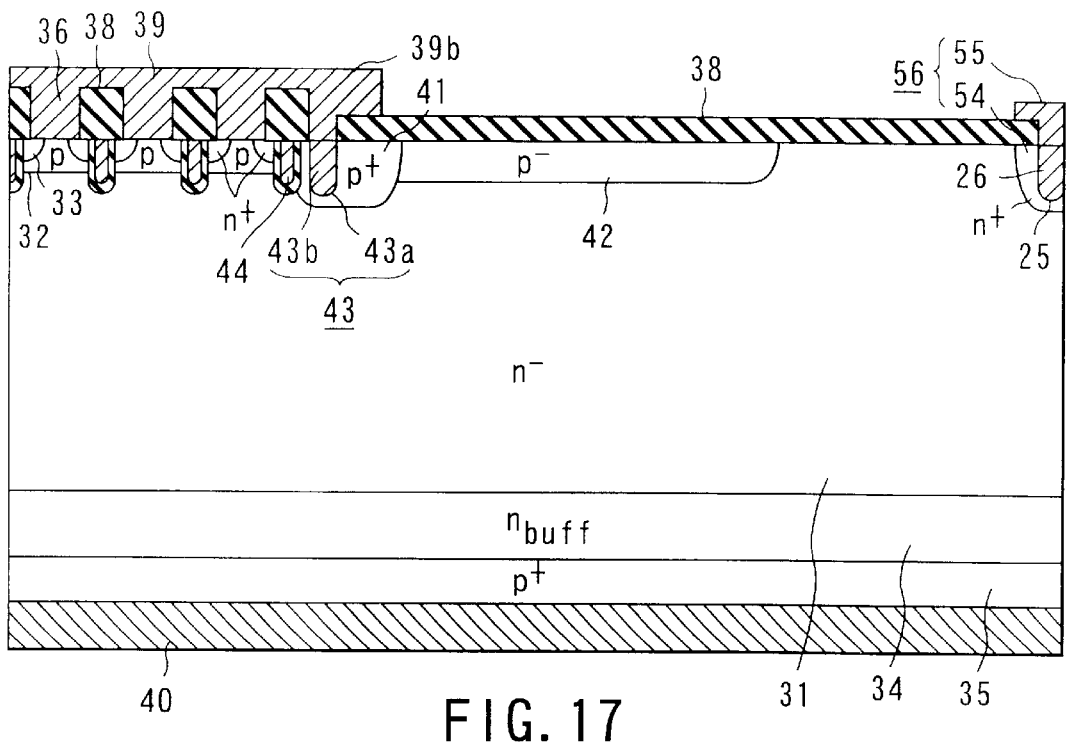
FIG. 17 is a sectional view schematically showing the junction-termination region and a portion of the active area near there, of an IGBT according to a fifteenth embodiment of the present invention.

FIG. 17 is a sectional view schematically showing the junction-termination region and a portion of the active area near there, of an IGBT according to a fifteenth embodiment of the present invention;

In this embodiment, the structure of the fourteenth embodiment is modified such that a ring-like low-resistivity layer 26 having a resistivity lower than that of an n⁺-diffusion layer 54 is formed in the surface of the layer 54. The low-resistivity layer 26 is disposed in a trench 25 formed in the n⁺-diffusion layer 54. The low-resistivity layer 26 is electrically connected to a stopper electrode 55. The function and manufacturing method of the low-resistivity layer 26 have been explained with reference to FIG. 3.

Particularly, where the low-resistivity layer 26, as well as the low-resistivity layer 43, is made of a material the same as that of the emitter electrode 39, the low-resistivity layer 26, as well as the low-resistivity layer 43, can be formed along with the emitter electrode 39 in the same step by patterning a conductive film common to the emitter electrode 39. Furthermore, where the trenches 45, 43a, and 25 have substantially the same depth, they are easily formed at the same time.

Sixteenth Embodiment

Figure 18:
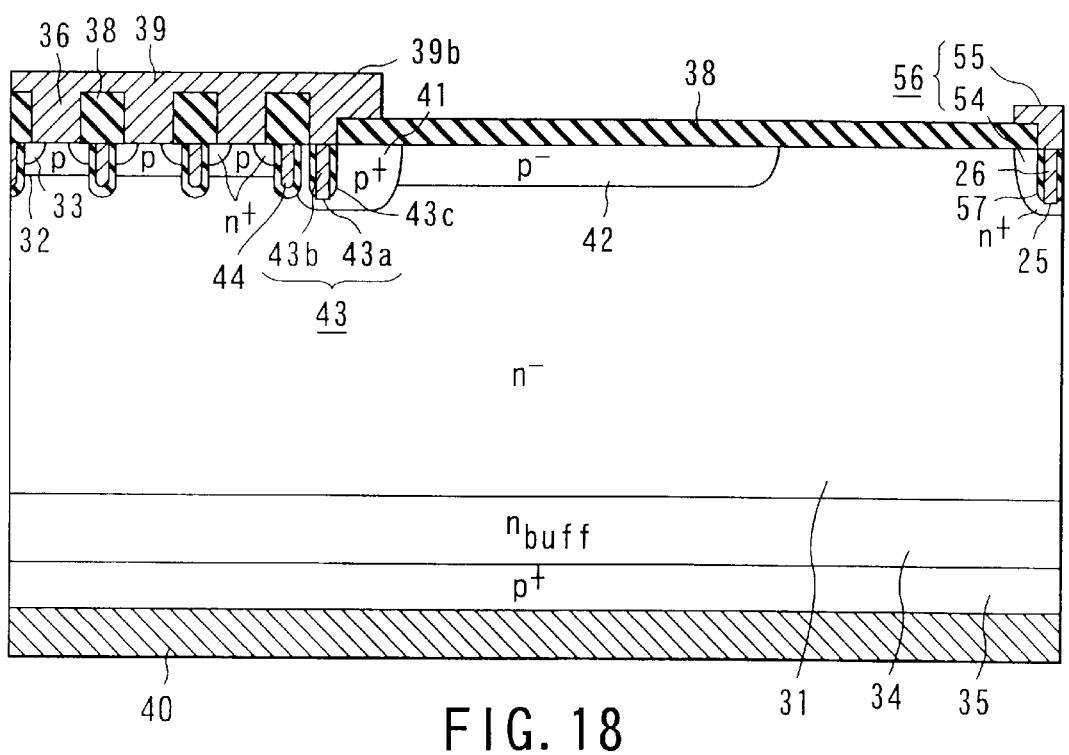
FIG. 18 is a sectional view schematically showing the junction-termination region and a portion of the active area near there, of an IGBT according to a sixteenth embodiment of the present invention.

FIG. 18 is a sectional view schematically showing the junction-termination region and a portion of the active area near there, of an IGBT according to a sixteenth embodiment of the present invention.

In this embodiment, the structure of the fifteenth embodiment is modified such that oxide films 43c and 57 are formed on the sidewalls in trenches 43a and 25. Even this arrangement provides effects the same as those of the fifteenth embodiment. The structure of this embodiment may be formed by the following method.

Specifically, when buried gate structures are formed in trenches 45, buried gate structures, each formed of an insulating oxide film and an electrode, are also formed in the trenches 43a and 25. Then, only the electrodes are removed from the buried gate structures in the trenches 43a and 25 to leave the insulating oxide films 43c and 57. Then, the portions of the insulating oxide films 43c and 57 at the bottom of trenches 43a and 25 are removed by an anisotropic etching. Then, when an emitter electrode 39 is formed, the electrode material is buried in the trenches 43a and 25.

Seventeenth Embodiment

Figure 19:
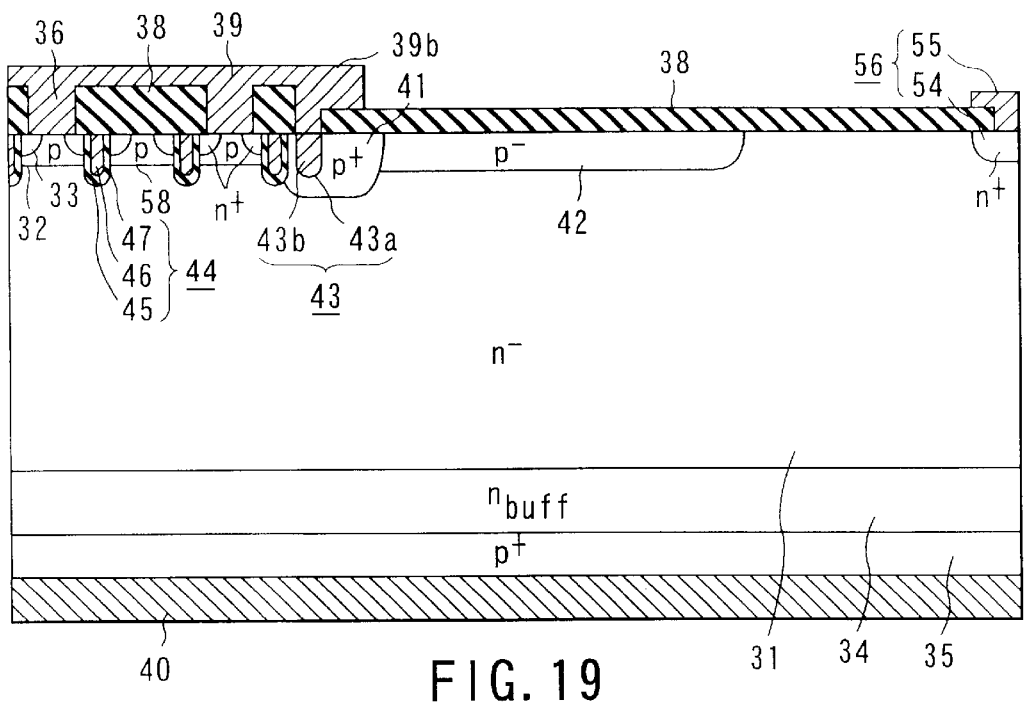
FIG. 19 is a sectional view schematically showing the junction-termination region and a portion of the active area near there, of an IGBT according to a seventeenth embodiment of the present invention.

FIG. 19 is a sectional view schematically showing the junction-termination region and a portion of the active area near there, of an IGBT according to a seventeenth embodiment of the present invention.

In this embodiment, the structure of the fourteenth embodiment is modified such that there are dummy gap portions 58, each of which is formed of a semiconductor layer portion between two trenches 45 and out of contact with an emitter electrode 39. The dummy gap portions 58 and current-passageway gap portions are alternately disposed. Not being limited to one dummy gap portion 58, two or more dummy gap portions 58 may be disposed between two current-passageway gap portions, which are adjacent to each other.

Also in this embodiment, a low-resistivity layer 43 formed in a p$^+$-ring layer 41 improves the withstanding property of the IGBT against breakdown. In addition, the dummy gap portions 58 further increase resistance against the flow of holes from an n$^-$-base layer 31 toward the emitter electrode 39 in an ON-state of the IGBT. With this arrangement, it is possible to further increase the ability to inject electrons from n$^+$-emitter layers 33 into the n$^-$-base layer 31.

Eighteenth Embodiment

Figure 20:
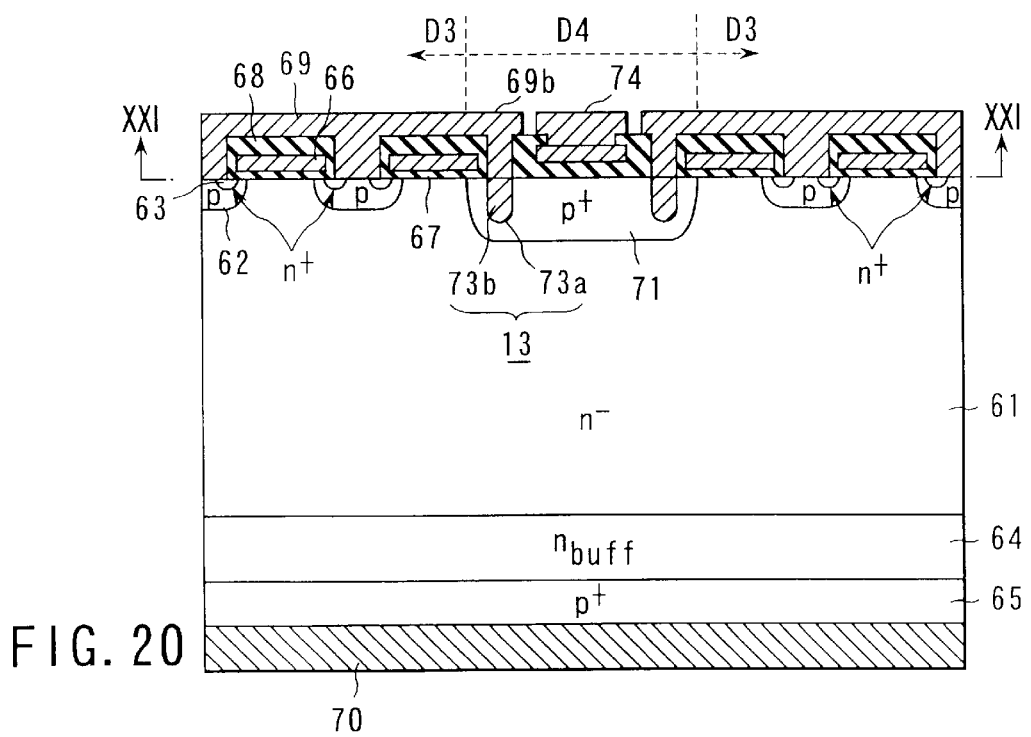
FIG. 20 is a sectional view schematically showing the active area of an IGBT according to an eighteenth embodiment of the present invention.
Figure 21:
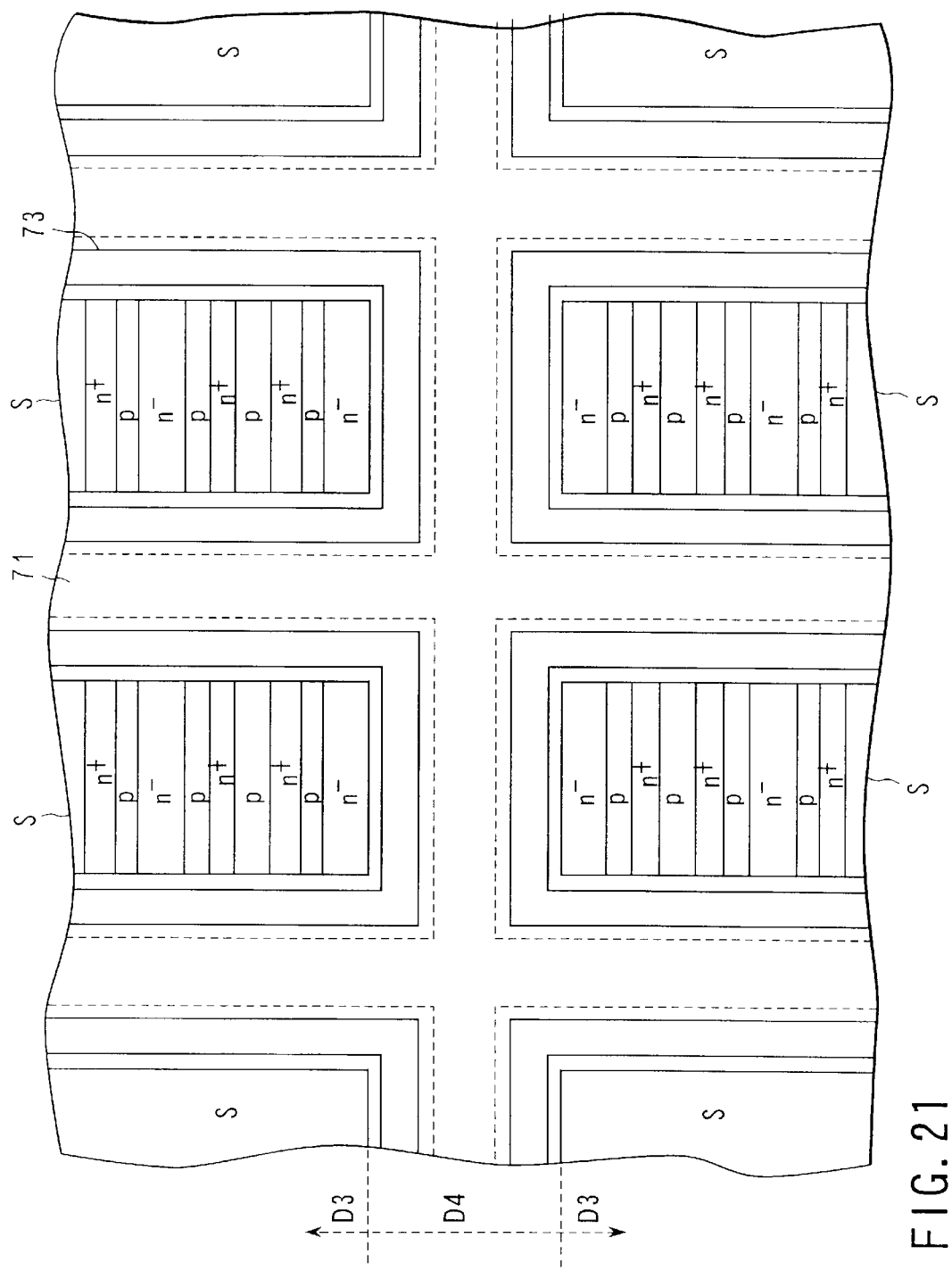
FIG. 21 is a plan view taken along line XXI—XXI in FIG. 20.

FIG. 20 is a sectional view schematically showing the active area of an IGBT according to an eighteenth embodiment of the present invention. FIG. 21 is a plan view taken along line XXI—XXI in FIG. 20.

An IGBT having a large surface area may have emitter electrodes respectively allocated to divided areas and gate wirings disposed around the emitter electrodes, in order to prevent gate signal delays. An IGBT having such a structure is sometimes provided with a p$^+$-ring layer under the gate wirings, thereby preventing the breakdown voltage from lowering. This embodiment relates to a relationship between each of active areas, which respectively correspond to divided areas and in which arrays of IGBT unit cells are disposed, and a surrounding region surrounding the active areas.

As shown in FIG. 20, an n$^-$-base layer (a first base layer) 61 is disposed as a semiconductor active layer common to active areas D3, in which arrays of IGBT unit cells are disposed, and a surrounding region D4 surrounding the active areas. The n$^-$-base layer 61 has a first main surface (the top side) and a second main surface (the bottom side) opposite to each other. A plurality of p-base layers (second base layers) 62 are selectively formed in stripes by diffusion in the active areas on the top side of the n$^-$-base layer 61.

Two n$^+$-emitter layers (first emitter layers) 63 are selectively formed in stripes by diffusion in each of the p-base layers 62. A gate electrode 66 is formed through a gate insulating film 67 on the portion between one of the n$^+$-emitter layers 63 in one of each pair of two p-base layers 62, which are adjacent to each other, and one of the n$^+$-emitter layers 63 in the other of the two p-base layers 62. A gate electrode 66 is also formed through a gate insulating film 67 on the portion between one of the n$^+$-emitter layers 63 in each outermost p-base layer 62 and each p$^+$-ring layer 71 described later.

Emitter electrodes (first main electrodes) 69 are disposed in ohmic-contact with the p-base layers 62 and the n$^+$-emitter layers 63 at respective positions on the p-base layers 62. Each emitter electrode 69 is disposed on the gate electrodes 66 through an insulating protection film 68. A p$^+$-emitter layer (a second emitter layer) 65 is formed through an n-buffer layer 64 on the bottom side of the n$^-$-base layer 61. A collector electrode (a second main electrode) 70 is disposed in ohmic-contact with the p$^+$-emitter layer 65.

As shown in FIG. 21, p$^+$-ring layers (formed of one integral p$^+$-layer) 71 are formed in the surrounding region D4 and surround the active areas D3 in which the arrays S of IGBT unit cells are formed. Each p$^+$-ring layer 71 is electrically connected to the corresponding emitter electrode 69 through a connection electrode 69b, which is integral with the emitter electrode 69. Gate wirings 74 for supplying the gate electrodes 66 with a potential is disposed on the p$^+$-ring layers 71 through the insulating protection film 68 and surrounds the active areas D3.

Ring-like low-resistivity layers 73 having a resistivity lower than that of the p$^+$-ring layers 71 are respectively formed in the surface of the layers 71. Each low-resistivity layer 73 has a resistivity of from $1 \times 10^{-6}$ to $1 \times 10^{-3}$ $\Omega \cdot$cm and a depth of from 0.5 to 8 $\mu$m. Each low-resistivity layer 73 is disposed on the corresponding active area side relative to the center of the p$^+$-ring layer 71. Each low-resistivity layer 73 is electrically connected to the corresponding emitter electrode 69 through the connection electrode 69b, which is integral with the emitter electrode 69. Each low-resistivity layer 73 is made of a conductive material 73b buried in a trench 73a formed in the p$^+$-ring layer 71.

As the conductive material 73b of the low-resistivity layers 73, a metal the same as that of the emitter electrodes 69 and the connection electrodes 69b, such as aluminum (Al) used in general, is preferably used, because its contact resistance with the emitter electrodes is negligible. Where the conductive material 73b is the same as the material of the emitter electrodes 69, the low-resistivity layers 73 can be formed along with the emitter electrodes 69 in the same step by patterning a conductive film common to the emitter electrodes 69. On the other hand, where it is necessary to consider a thermal treatment to be performed in a later step, a refractory metal, such as Mo, Ti, or W, is preferably used as the conductive material 73b. Furthermore, the conductive material 73b may consist of a semiconductor, such as polycrystalline silicon, which is of a conductivity type the same as that of the p$^+$-ring layers 71 and has a carrier impurity concentration higher than that of p$^+$-ring layers 71.

Each low-resistivity layer 73 is disposed close to the pn junction between the n$^-$-base layer 61 and the corresponding p$^+$-ring layer 71. With this arrangement, a hole current concentrating at the p$^+$-ring layer 71 is allowed to swiftly flow into the emitter electrode 69. Each low-resistivity layer 73 is partially disposed on the corresponding p-base layers 62 side relative to the center of the p$^+$-ring layer 71. With this arrangement, a smaller amount of hole current is allowed to flow into the p-base layers 62.

When the IGBT is turned on, the following operation is performed. Specifically, while a positive bias is applied between the collector electrode 70 and the emitter electrodes 69 (the plus is on the collector electrode 70 side), a positive voltage (a positive bias) relative to the emitter electrodes 69 is applied to the gate electrodes 66. By doing so, n-inversion layers (not shown) are formed near the interfaces between the p-base layers 62 and the gate insulating films 67, and thus electrons are injected from the n$^+$-emitter layers 63 into the n$^-$-base layer 61. In accordance with the injection amount of the electrons, holes are injected from the p$^+$-emitter layer 65 into the n$^-$-base layer 61. As a result, the n$^-$-base layer 61 is filled with carriers and causes a conductivity modulation, and thus the resistance of the n$^-$-base layer 61 decreases to bring the IGBT into an ON-state.

On the other hand, when the IGBT is turned off, the following operation is performed. Specifically, in the ON-state described above, a negative bias is applied to the gate electrodes 66. By doing so, the n-inversion layers near the interfaces between the p-base layers 62 and the gate insulating films 67 disappear, and thus electrons stop being injected from the n$^+$-emitter layers 63 into the n$^-$-base layer 61. As a result, holes also stop being injected from the p$^+$-emitter layer 65 into the n$^-$-base layer 61. Then, carriers filling the n$^-$-base layer 61 are exhausted, and depletion layers expand from the junctions between the p-base layers 62 and the n$^-$-base layer 61 to bring the IGBT into an OFF-state.

During the turn-off operation, holes accumulated in the n$^-$-base layer 61 are exhausted through the p$^+$-ring layers 71, the low-resistivity layers 73, and the connection electrodes 69$b$ into the emitter electrodes 69, and through the p-base layers 62 into the emitter electrodes 69. Since the low-resistivity layers 73 formed in the p$^+$-ring layers 71 allow holes to easily flow, a hole current concentrates at the p$^+$-ring layers 71 preferentially to the adjacent p-base layers 62. Consequently, the adjacent p-base layers 62 are prevented from increasing the potential, thereby improving the withstanding property of the IGBT against breakdown.

The distance from the pn junction between each p$^+$-ring layer 71 and the n$^-$-base layer 61 to the corresponding low-resistivity layer 73 is set to be a distance at which a depletion layer extends from the pn junction into the p$^+$-ring layer 71 when the IGBT is statically withstanding in an OFF-state. With this arrangement, the low-resistivity layer 73 can be utilized as a protection mechanism when the IGBT is supplied with an excessive voltage.

The relationship between the active areas D3 and the surrounding region D4 according to this embodiment is also established even where the structure of each active area D3 is replaced with that of the active area D1 shown in FIG. 15. The gate wirings 74 may further extend on a p$^+$-ring layer formed in a junction-termination region, in order to prevent gate signal delays near the junction-termination region.

Nineteenth Embodiment

Figure 22:
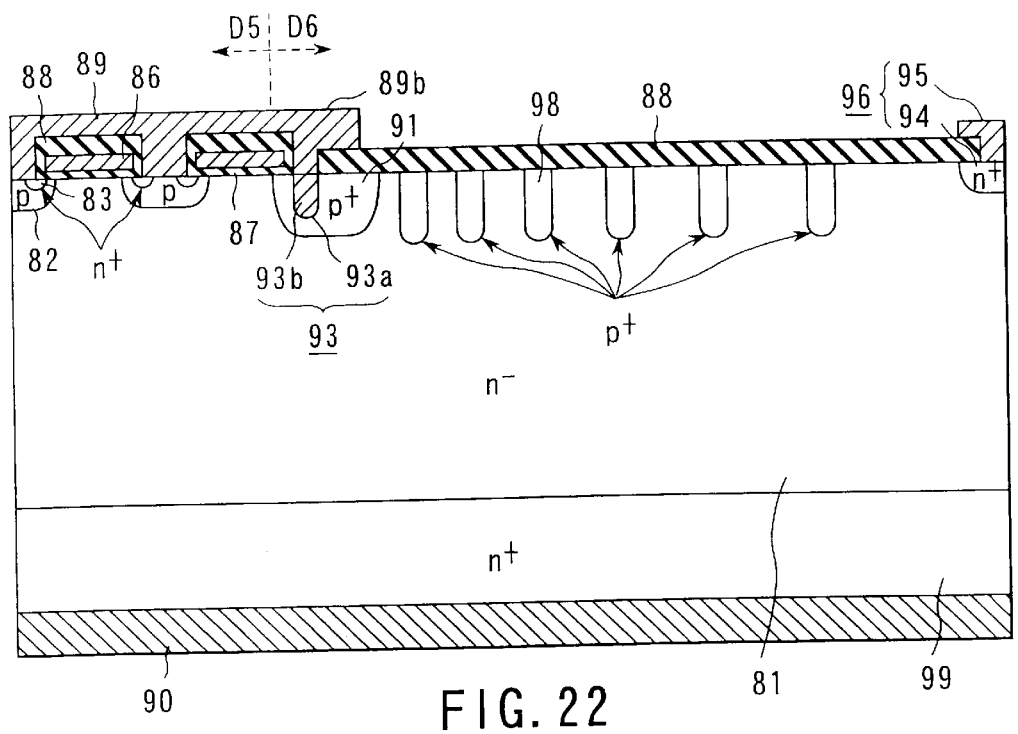
FIG. 22 is a sectional view schematically showing the junction-termination region and a portion of the active area near there, of a power MOSFET according to a nineteenth embodiment of the present invention.
Figure 23:
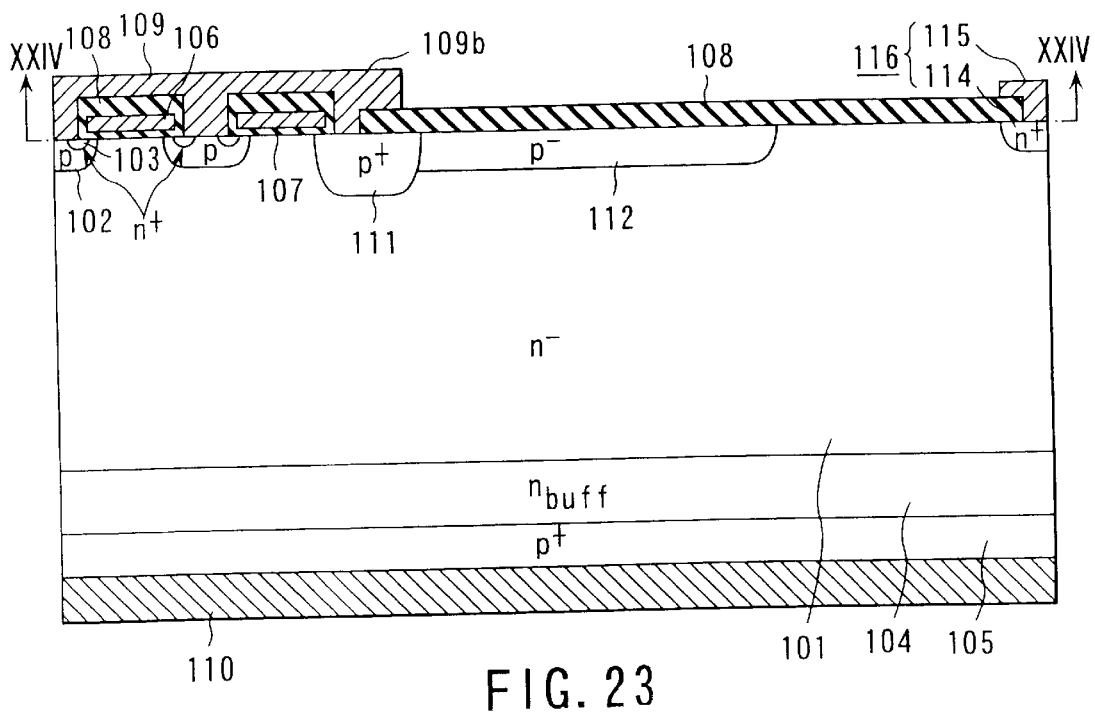
FIG. 23 is a sectional view schematically showing the junction-termination region and a portion of the active area near there, of a conventional IGBT.
Figure 24:
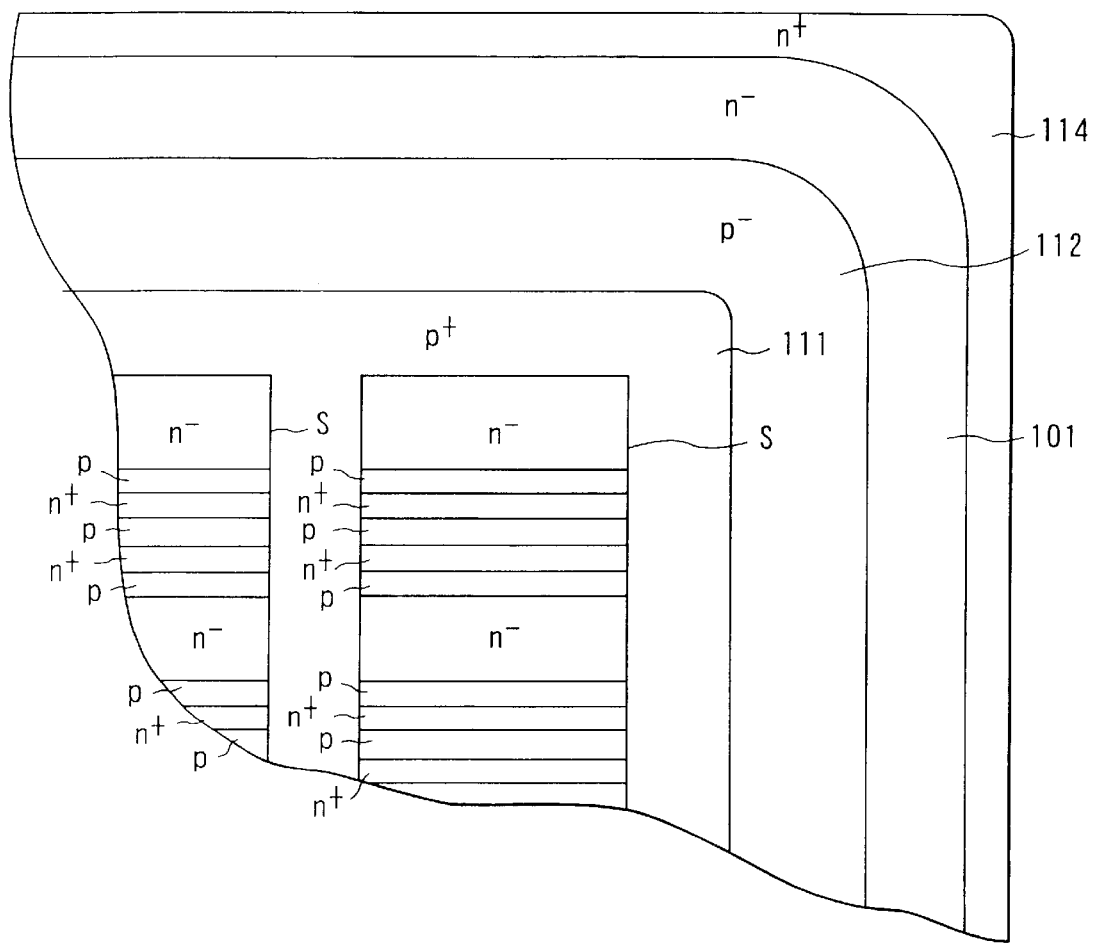
FIG. 24 is a plan view taken along line XXIV—XXIV in FIG. 23.

FIG. 22 is a sectional view schematically showing the junction-termination region and a portion of the active area near there, of a power MOSFET according to a nineteenth embodiment of the present invention.

As shown in FIG. 22, an n$^-$-base layer (a first base layer) 81 is disposed as a semiconductor active layer common to the central area (corresponding to an active area) D5, in which arrays of MOSFET unit cells are disposed, and the peripheral region (corresponding to a junction-termination region) D6 surrounding the central area. The n$^-$-base layer 81 has a first main surface (the top side) and a second main surface (the bottom side) opposite to each other. A plurality of p-base layers (second base layers) 82 are selectively formed in stripes by diffusion in the central area on the top side of the n$^-$-base layer 81.

Two n$^+$-emitter layers (first emitter layers) 83 are selectively formed in stripes by diffusion in each of the p-base layers 82. A gate electrode 86 is formed through a gate insulating film 87 on the portion between one of the n$^+$-emitter layers 83 in one of each pair of two p-base layers 82, which are adjacent to each other, and one of the n$^+$-emitter layers 83 in the other of the two p-base layers 82. A gate electrode 86 is also formed through a gate insulating film 87 on the portion between one of the n$^+$-emitter layers 83 in each outermost p-base layer 82 and a p$^+$-ring layer 91 described later.

An emitter electrode (a first main electrode) 89 is disposed in ohmic-contact with the p-base layers 82 and the n$^+$-emitter layers 83 at respective positions on the p-base layers 82. The emitter electrode 89 is disposed on the gate electrodes 86 through an insulating protection film 88. An n$^+$-drain layer 99, which is of a conductivity type the same as that of the n$^-$-base layer 81 and has a carrier impurity concentration higher than that of the n$^-$-base layer 81, is formed on the bottom side of the n$^-$-base layer 81. A collector electrode (a second main electrode) 90 is disposed in ohmic-contact with the n$^+$-drain layer 99.

A p$^+$-ring layer 91 is formed in the junction-termination region D6 and surrounds the central area (the active area) D5 in which the arrays S of MOSFET unit cells are formed. The p$^+$-ring layer 91 is electrically connected to the emitter electrode 89 through a connection electrode 89$b$, which is integral with the emitter electrode 89.

A ring-like n$^+$-diffusion layer 94 is formed in the junction-termination region, along the peripheral edge thereof. The n$^+$-diffusion layer 94 is of a conductivity type the same as that of the n$^-$-base layer 81 and has a carrier impurity concentration higher than that of the n$^-$-base layer 81. A ring-like stopper electrode 95 in an electrically floating state is disposed on the n$^+$-diffusion layer 94. The n$^+$-diffusion layer 94 and the stopper electrode 95 constitute an equipotential ring 96. The surface of the n$^-$-base layer 81 from the p$^+$-ring layer 91 to the n$^+$-diffusion layer 94 is covered with an insulating protection film 88.

A plurality of p$^+$-guard ring layers 98 are formed in the surface of the n$^-$-base layer 81 between the p$^+$-ring layer 91 and the n$^+$-diffusion layer 94. The p$^+$-guard ring layers 98 are of a conductivity type the same as that of the p$^+$-ring layer 91 and have a carrier impurity concentration higher than that of the p$^+$-ring layer 91. The distances between the p$^+$-guard ring layers 98 become gradually larger toward the peripheral edge.

A ring-like low-resistivity layer 93 having a resistivity lower than that of the p$^+$-ring layer 91 is formed in the surface of the layer 91. The low-resistivity layer 93 has a resistivity of from $1 \times 10^{-6}$ to $1 \times 10^{-3}$ $\Omega \cdot$cm and a depth of from 0.5 to 8 $\mu$m. The low-resistivity layer 93 is disposed on the active area side relative to the center of the p$^+$-ring layer 91. The low-resistivity layer 93 is electrically connected to the emitter electrode 89 through the connection electrode 89$b$, which is integral with the emitter electrode 89. The low-resistivity layer 93 is made of a conductive material 93$b$ buried in a trench 93$a$ formed in the p$^+$-ring layer 91.

As the conductive material 93$b$ of the low-resistivity layer 93, a metal the same as that of the emitter electrode 89 and the connection electrode 89$b$, such as aluminum (Al) used in general, is preferably used, because its contact resistance with the emitter electrode is negligible. Where the conductive material 93b is the same as the material of the emitter electrode 89, the low-resistivity layer 93 can be formed along with the emitter electrode 89 in the same step by patterning a conductive film common to the emitter electrode 89. On the other hand, where it is necessary to consider a thermal treatment to be performed in a later step, a refractory metal, such as Mo, Ti, or W, is preferably used as the conductive material 93b. Furthermore, the conductive material 93b may consist of a semiconductor, such as polycrystalline silicon, which is of a conductivity type the same as that of the p$^+$-ring layer 91 and has a carrier impurity concentration higher than that of p$^+$-ring layer 91.

The low-resistivity layer 93 is disposed close to the pn junction between the n$^-$-base layer 81 and the p$^+$-ring layer 91. With this arrangement, a hole current concentrating at the p$^+$-ring layer 91 is allowed to swiftly flow into the emitter electrode 89. The low-resistivity layer 93 is partially disposed on the p-base layers 82 side relative to the center of the p$^+$-ring layer 91. With this arrangement, a smaller amount of hole current is allowed to flow into the p-base layers 82.

When the power MOSFET is turned on, the following operation is performed. Specifically, while a positive bias is applied between the collector electrode 90 and the emitter electrode 89 (the plus is on the collector electrode 90 side), a positive voltage (a positive bias) relative to the emitter electrode 89 is applied to the gate electrodes 86. By doing so, n-inversion layers (not shown) are formed near the interfaces between the p-base layers 82 and the gate insulating films 87, and thus electrons are injected from the n$^+$-emitter layers 83 into the n$^-$-base layer 81. The electrons flow from the n$^-$-base layer 81 into the n$^+$-drain layer 99 to bring the MOSFET into an ON-state.

On the other hand, when the power MOSFET is turned off, the following operation is performed. Specifically, in the ON-state described above, a zero bias or a negative bias is applied to the gate electrodes 86. By doing so, the n-inversion layers near the interfaces between the p-base layers 82 and the gate insulating films 87 disappear, and thus electrons stop being injected from the n$^+$-emitter layers 83 into the n$^-$-base layer 81. As a result, the MOSFET is brought into an OFF-state.

Since the MOSFET does not generate hole currents in ON-states, there is no breakdown caused by a latched-up state due to hole current concentration. However, in an inverter circuit in which the MOSFET is generally used, parasitic diodes formed of the p-base layers 82 and the n-drain layer 99 are activated. Specifically, there is a case where a positive bias relative to the collector electrode 90 is applied to the emitter electrode 89, so that holes are injected from the p-base layers 82 and electrons are injected from the n-drain layer 99, both into the n$^-$-base layer 81, thereby bringing the parasitic diodes into an ON-state.

When the bias is inverted from this state, i.e., a negative bias relative to the collector electrode 90 is applied to the emitter electrode 89, holes accumulated in the n$^-$-base layer 81 are exhausted through the emitter electrode 89 out of the device. In this state, a hole current flows into the p-base layers 82 and into the p$^+$-ring layer 91. Since the low-resistivity layer 93 formed in the p$^+$-ring layer 91 allows holes to easily flow, a hole current concentrates at the p$^+$-ring layer 91 preferentially to the adjacent p-base layers 82. Consequently, the adjacent p-base layers 82 are prevented from increasing the potential, thereby improving the withstanding property of the MOSFET against breakdown.

The p$^+$-guard ring layers 98 cause the potential to gradually increase from the p$^+$-ring layer 91 to an equi-potential ring 96 in an OFF-state of the MOSFET. In other words, the p$^+$-guard ring layers 98 function to laterally expand an equi-potential plane in an OFF-state, thereby relaxing electrical field concentration to improve the breakdown voltage. The breakdown voltage can be controlled by changing the number of the p$^+$-guard ring layers 98.

The nineteenth embodiment can be combined with any one of the features described with reference to the first to eighteenth embodiments. Furthermore, the features of the first to eighteenth embodiments can be suitably combined with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high breakdown voltage semiconductor device including an active area, and a surrounding region surrounding the active area, comprising:

a first semiconductor layer of a first conductivity type disposed as a semiconductor active layer common to the active area and the surrounding region, the first semiconductor layer having first and second main surfaces opposite to each other;

a second semiconductor layer of a second conductivity type formed in the first main surface of the first semiconductor layer in the active area;

a third semiconductor layer of the first conductivity type formed in a surface of the second semiconductor layer;

a fourth semiconductor layer disposed on or in the second main surface of the first semiconductor layer in the active area;

a gate electrode facing, through a gate insulating film, a portion of the second semiconductor layer between the first semiconductor layer and the third semiconductor layer;

a first main electrode electrically connected to the second semiconductor layer and the third semiconductor layer;

a second main electrode electrically connected to the fourth semiconductor layer;

a ring layer of the second conductivity type formed in the first main surface of the first semiconductor layer and surrounding the active area at a position in the surrounding region adjacent to the active area;

a first low-resistivity layer formed in a surface of the ring layer and having a resistivity lower than that of the ring layer, the first low-resistivity layer comprising a metal or polycrystalline silicon of the second conductivity type and having a resistivity of from $1 \times 10^{-6}$ to $1 \times 10^{-3}$ $\Omega$cm; and a connection electrode electrically connecting the first low-resistivity layer to the first main electrode.

2. A device according to claim 1, wherein the first low-resistivity layer is disposed on the active area side relative to a center of the ring layer.

3. A device according to claim 1, wherein the first low-resistivity layer has a depth of from 0.5 to 8 $\mu$m.

4. A device according to claim 1, wherein the first low-resistivity layer in disposed in a trench formed in the ring layer, and the first low-resistivity layer and the connection electrode comprise a metal layer integral with the first main electrode.

5. A device according to claim 1, further comprising a second low-resistivity layer formed in a surface of the second semiconductor layer and having a resistivity lower than that of the second semiconductor layer, the second low-resistivity layer being disposed in contact with the first main electrode and the second and third semiconductor layers.

6. A device according to claim 5, wherein the first and second low-resistivity layers consist essentially of substantially the same material.

7. A device according to claim 6, wherein the first and second low-resistivity layers are disposed in trenches formed in the ring layer and the second semiconductor layer, respectively.

8. A device according to claim 7, wherein the first and second low-resistivity layers are derived from a conductive film common to the first main electrode.

9. A device according to claim 8, wherein the trenches accommodating the first and second low-resistivity layers have substantially the same depth.

10. A device according to claim 1, wherein the gate insulating film comprises first and second portions formed on the second and first semiconductor layers, respectively, the second portion being thicker than the first portion.

11. A device according to claim 1, wherein the gate insulating film and the gate electrode are buried in a trench formed in the first semiconductor layer.

12. A device according to claim 11, wherein the gate electrode comprises a plurality of gate electrode portions respectively buried in a plurality of trench portions, which are formed in the first semiconductor layer with a gap therebetween, and the gap between the trench portions forms a current passageway narrow enough to increase resistance against flow of carriers of the second conductivity type from the first semiconductor layer toward the first main electrode in an ON-state of the IGBT, thereby increasing ability to inject carriers of the first conductivity type from the third semiconductor layer into the first semiconductor layer.

13. A device according to claim 12, further comprising a dummy gap portion formed of a semiconductor layer portion between two of the trench portions and out of contact with the first main electrode.

14. A device according to claim 1, wherein the fourth semiconductor layer is of the second conductivity type.

15. A device according to claim 1, wherein the fourth semiconductor layer is of the first conductivity type and has a carrier impurity concentration higher than that of the first semiconductor layer.

16. A device according to claim 1, wherein the active area comprises a plurality of active area portions juxtaposed on the first semiconductor layer, and the surrounding region surrounds each of the active area portions.

17. A device according to claim 1, wherein the surrounding region is a junction-termination region disposed along a peripheral edge of the first semiconductor layer.

18. A device according to claim 17, further comprising an end layer of the first conductivity type formed in the first main surface of the first semiconductor layer along a peripheral edge of the first semiconductor layer, the end layer having a carrier impurity concentration higher than that of the first semiconductor layer.

19. A device according to claim 18, further comprising a third low-resistivity layer formed in a surface of the end layer and having a resistivity lower than that of the end layer.

20. A device according to claim 19, wherein the first and third low-resistivity layers consist essentially of substantially the same material.

21. A device according to claim 20, wherein the first and third low-resistivity layers are disposed in trenches formed in the ring layer and the end layer, respectively.

22. A device according to claim 21, wherein the first and third low-resistivity layers are derived from a conductive film common to the first main electrode.

23. A device according to claim 21, wherein the trenches accommodating the first and third low-resistivity layers have substantially the same depth.

24. A device according to claim 17, further comprising a protection film covering the first main surface of the first semiconductor layer and consisting essentially of a material selected from the group consisting of insulating materials and semi-insulating materials.

25. A device according to claim 24, further comprising a conductive field plate extending on top of the protection film in the junction-termination region, the field plate being electrically connected to the first main electrode.

26. A device according to claim 17, further comprising a RESURF layer of the second conductivity type formed in the first main surface of the first semiconductor layer, disposed in contact with the ring layer, and extending in the junction-termination region, the RESURF layer having a carrier impurity concentration lower than that of the ring layer.

27. A device according to claim 17, further comprising a guard ring layer of the second conductivity type formed in the first main surface of the first semiconductor layer in the junction termination region.

28. A device according to claim 27, further comprising a fourth low-resistivity layer formed in a surface of the guard ring layer and having a resistivity lower than that of the guard ring layer.

29. A device according to claim 28, wherein the first and fourth low-resistivity layers consist essentially of substantially the same material.

30. A device according to claim 29, wherein the first and fourth low-resistivity layers are disposed in trenches formed in the ring layer and the guard ring layer, respectively.

31. A device according to claim 30, wherein the first and fourth low-resistivity layers are derived from a conductive film common to the first main electrode.

32. A device according to claim 30, wherein the trenches accommodating the first and fourth low-resistivity layers have substantially the same depth.

33. A high breakdown voltage semiconductor device including an active area, and a junction-termination region surrounding the active area, comprising:

a first semiconductor layer of a first conductivity type disposed as a semiconductor active layer common to the active area and the junction-termination region, the first semiconductor layer having first and second main surfaces opposite to each other;

a second semiconductor layer of a second conductivity type formed in the first main surface of the first semiconductor layer in the active area;

a third semiconductor layer of the first conductivity type formed in a surface of the second semiconductor layer;

a fourth semiconductor layer disposed on or in the second main surface of the first semiconductor layer in the active area;

a gate electrode facing, through a gate insulating film, a portion of the second semiconductor layer between the first semiconductor layer and the third semiconductor layer;

a first main electrode electrically connected to the second semiconductor layer and the third semiconductor layer;

a second main electrode electrically connected to the fourth semiconductor layer;

a ring layer of the second conductivity type formed in the first main surface of the first semiconductor layer and surrounding the active area at a position in the junction-termination region adjacent to the active area;

a first low-resistivity layer formed in a surface of the ring layer and having a resistivity lower than that of the ring layer, the first low-resistivity layer comprising a metal or polycrystalline silicon of the second conductivity type and having a resistivity of from $1 \times 10^{-6}$ to $1 \times 10^{-3}$ $\Omega$cm;

a connection electrode electrically connecting the first low-resistivity layer to the first main electrode;

a second low-resistivity layer formed in a surface of the second semiconductor layer and having a resistivity lower than that of the second semiconductor layer, the second low-resistivity layer being disposed in contact with the first main electrode and the second and third semiconductor layers, the second low-resistivity layer consisting essentially of a material the same as that of the first low-resistivity layer;

an end layer of the first conductivity type formed in the first main surface of the first semiconductor layer along a peripheral edge of the first semiconductor layer in the junction-termination region, the end layer having a carrier impurity concentration higher than that of the first semiconductor layer; and a third low-resistivity layer formed in a surface of the end layer and having a resistivity lower than that of the end layer, the third low-resistivity layer consisting essentially of a material the same as that of the first low-resistivity layer.

34. A device according to claim 33, wherein the first, second, and third low-resistivity layers are disposed in trenches formed in the ring layer, the second semiconductor layer, and the end layer, respectively.

35. A device according to claim 34, wherein the first, second, and third low-resistivity layers are derived from a metal film common to the first main electrode.

36. A device according to claim 35, wherein the trenches accommodating the first, second, and third low-resistivity layers have substantially the same depth.

37. A device according to claim 33, further comprising a guard ring layer of the second conductivity type formed in the first main surface of the first semiconductor layer in the junction-termination region, and a fourth low-resistivity layer formed in a surface of the guard ring layer and having a resistivity lower than that of the guard ring layer.

38. A device according to claim 37, wherein the first to fourth low-resistivity layers consist essentially of substantially the same material.

39. A device according to claim 38, wherein the first to fourth low-resistivity layers are disposed in trenches formed in the ring layer, the second semiconductor layer, the end layer, and the guard ring layer, respectively.

40. A device according to claim 39, wherein the first to fourth low-resistivity layers are derived from a conductive film common to the first main electrode.

41. A device according to claim 39, wherein the trenches accommodating the first to fourth low-resistivity layers have substantially the same depth.

42. A high breakdown voltage semiconductor device including an active area, and a surrounding region surrounding the active area, comprising:

a first semiconductor layer of a first conductivity type disposed as a semiconductor active layer common to the active area and the surrounding region, the first semiconductor layer having first and second main surfaces opposite to each other;

a second semiconductor layer of a second conductivity type formed in the first main surface of the first semiconductor layer in the active area;

a third semiconductor layer of the first conductivity type formed in a surface of the second semiconductor layer;

a fourth semiconductor layer disposed on or in the second main surface of the first semiconductor layer in the active area;

a gate electrode facing, through a gate insulating film, a portion of the second semiconductor layer between the first semiconductor layer and the third semiconductor layer;

a first main electrode electrically connected to the second semiconductor layer and the third semiconductor layer;

a second main electrode electrically connected to the fourth semiconductor layer;

a ring layer of the second conductivity type formed in the first main surface of the first semiconductor layer and surrounding the active area at a position in the surrounding region adjacent to the active area;

a first low-resistivity layer formed in a surface of the ring layer and having a resistivity lower than that of the ring layer; and a connection electrode electrically connecting the first low-resistivity layer to the first main electrode, wherein the first low-resistivity layer is disposed in a trench formed in the ring layer, and the first low-resistivity layer and the connection electrode comprise a metal layer integral with the first main electrode.

43. A device according to claim 42, wherein the first low-resistivity layer has a resistivity of from $1 \times 10^{-6}$ to $1 \times 10^{-3}$ $\Omega$cm.

44. A device according to claim 42, wherein the first low-resistivity layer has a depth of from 0.5 to 8 $\mu$m.

* * * * *